(12) United States Patent
Chu et al.

(10) Patent No.: US 10,749,461 B2
(45) Date of Patent: *Aug. 18, 2020

(54) GLASS ROOF SHINGLE

(71) Applicant: CORNING INCORPORATED, Corning, NY (US)

(72) Inventors: Polly Wanda Chu, Painted Post, NY (US); Matthew John Dejneka, Corning, NY (US); Anis Fadul, Painted Post, NY (US); Lisa Lynn Griesbach Hawkins, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/688,018

(22) Filed: Nov. 19, 2019

(65) Prior Publication Data

US 2020/0091858 A1 Mar. 19, 2020

Related U.S. Application Data

(63) Continuation of application No. 16/111,650, filed on Aug. 24, 2018, now Pat. No. 10,651,781.

(60) Provisional application No. 62/549,650, filed on Aug. 24, 2017.

(51) Int. Cl.
| | | |
|---|---|---|
| *H02S 20/25* | (2014.01) |
| *B23B 3/26* | (2006.01) |
| *B23B 17/00* | (2006.01) |
| *H01L 31/048* | (2014.01) |
| *E04D 1/16* | (2006.01) |
| *H02S 30/10* | (2014.01) |
| *B32B 3/26* | (2006.01) |
| *B32B 17/00* | (2006.01) |

(52) U.S. Cl.
CPC .............. *H02S 20/25* (2014.12); *B32B 3/263* (2013.01); *B32B 17/00* (2013.01); *E04D 1/16* (2013.01); *H01L 31/048* (2013.01); *H01L 31/0481* (2013.01); *H02S 30/10* (2014.12); *B32B 2307/732* (2013.01); *B32B 2419/06* (2013.01)

(58) Field of Classification Search
CPC ..... H02S 20/25; H02S 30/10; H01L 31/0481; H01L 31/048; B32B 17/00; B32B 3/263; B32B 2307/732; B32B 2419/06; E04D 1/16
See application file for complete search history.

(56) References Cited

U.S. PATENT DOCUMENTS

| | | | | |
|---|---|---|---|---|
| 8,857,124 B2* | 10/2014 | Posnansky | .............. | E04D 1/125 52/547 |
| 9,634,168 B2* | 4/2017 | Laia | ........................ | H01L 31/05 |
| 9,673,344 B2* | 6/2017 | Davey | ....................... | H02S 20/23 |
| 9,966,898 B1* | 5/2018 | Flanigan | ................. | H02S 20/25 |
| 10,298,171 B2* | 5/2019 | Almy | ...................... | H02S 20/25 |
| 2010/0101157 A1* | 4/2010 | Posnansky | .............. | E04D 1/125 52/90.1 |

(Continued)

*Primary Examiner* — Rodney Mintz

(57) ABSTRACT

A glass roof shingle includes a shingle cover layer made of a glass. A shingle base layer is disposed underneath the shingle cover layer. The shingle base layer and shingle cover layer define a cavity. A seal area formed between the shingle base layer and shingle cover layer and around the cavity controls ingress of moisture into the cavity. A photovoltaic module may be disposed within the cavity.

16 Claims, 21 Drawing Sheets

(56) References Cited

U.S. PATENT DOCUMENTS

| | | | |
|---|---|---|---|
| 2011/0041428 A1* | 2/2011 | Posnansky | E04D 13/17 52/173.3 |
| 2012/0204927 A1* | 8/2012 | Peterson | H01L 31/048 136/244 |
| 2013/0032198 A1* | 2/2013 | Laia | H01L 31/05 136/251 |
| 2013/0067836 A1* | 3/2013 | Sherman | H02S 40/36 52/173.3 |
| 2014/0090695 A1* | 4/2014 | Rodrigues | H02S 30/10 136/251 |
| 2014/0284750 A1* | 9/2014 | Yu | H01L 31/02242 257/436 |
| 2016/0043255 A1* | 2/2016 | Davey | H01L 31/0508 136/251 |
| 2017/0210665 A1* | 7/2017 | Beall | C03B 32/02 |
| 2018/0115275 A1* | 4/2018 | Flanigan | H02S 20/25 |
| 2018/0123504 A1* | 5/2018 | Almy | H02S 20/25 |
| 2018/0254738 A1* | 9/2018 | Yang | H02S 40/36 |
| 2018/0337629 A1* | 11/2018 | Liu | H02S 20/25 |
| 2018/0342640 A1* | 11/2018 | Kang | B32B 17/10018 |
| 2018/0351501 A1* | 12/2018 | Seery | H02S 20/25 |
| 2018/0351502 A1* | 12/2018 | Almy | H02S 20/25 |
| 2019/0020301 A1* | 1/2019 | Flanigan | H02S 20/25 |
| 2019/0028055 A1* | 1/2019 | Yang | H02S 20/25 |
| 2019/0068109 A1* | 2/2019 | Chu | H02S 20/25 |
| 2019/0088802 A1* | 3/2019 | Kang | H01L 31/02167 |
| 2019/0089293 A1* | 3/2019 | Almy | H02S 40/36 |
| 2019/0097571 A1* | 3/2019 | Lefevre | H02S 20/25 |
| 2019/0123680 A1* | 4/2019 | Rodrigues | E04D 1/22 |
| 2019/0296683 A1* | 9/2019 | Honeker | H01L 31/048 |
| 2019/0348553 A1* | 11/2019 | Davey | H02S 40/34 |

* cited by examiner

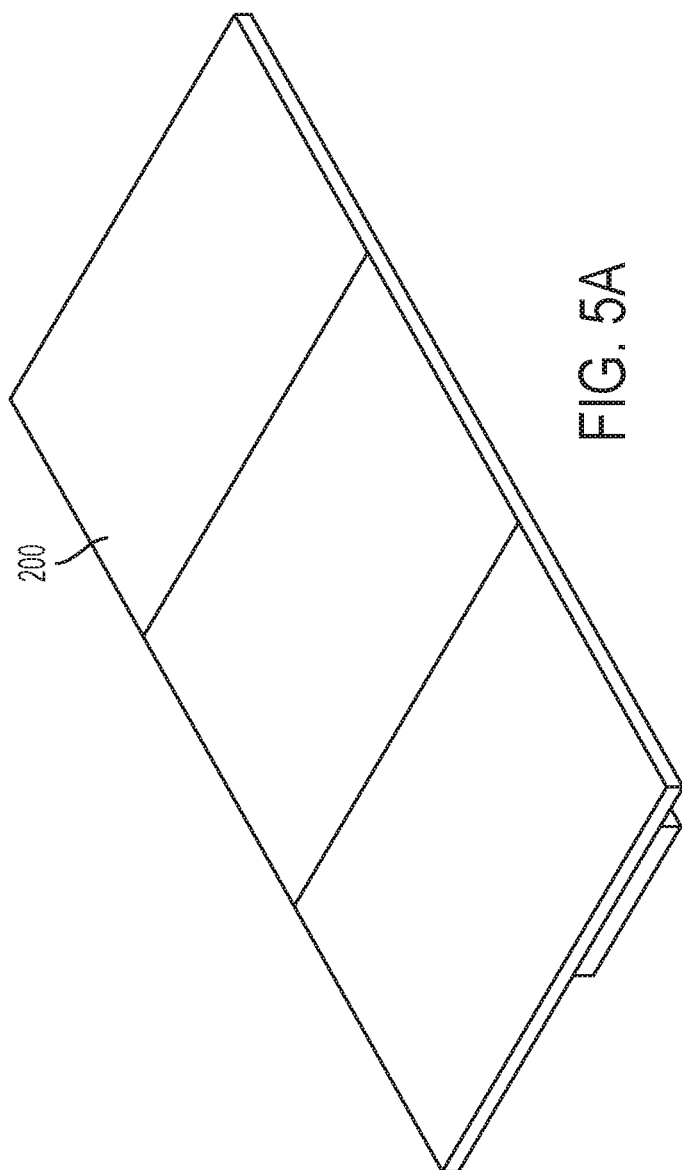
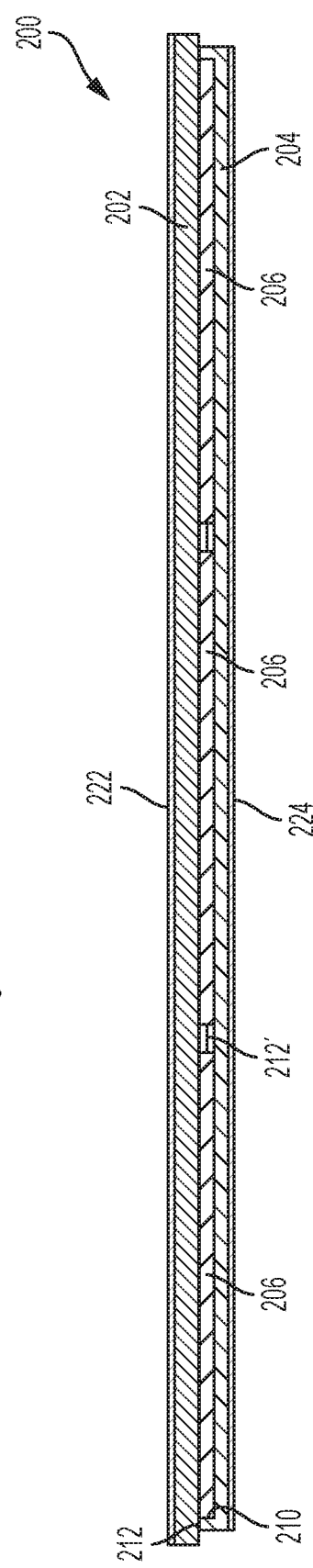
FIG. 5A
FIG. 5B

GLASS ROOF SHINGLE

This application is a Continuation of U.S. patent application Ser. No. 16/111,650 filed on Aug. 24, 2018, which claims the benefit of priority under 35 U.S.C. § 119 of U.S. Provisional Application Ser. No. 62/549,650 filed on Aug. 24, 2017, the content of each of which each relied upon and incorporated herein by reference in their entireties.

BACKGROUND

Solar power is a promising alternative to current fossil fuels for home electrical needs. However, efficient use of roof or other spaces for solar panel treatment is a continuing challenge. Conventional solar panels are large, bulky devices that can be aesthetically unpleasing and add considerable weight to a conventional roof. Alternatives have been designed, but these alternatives have suffered from low efficiencies, challenges in manufacturing, high costs, or like conventional solar panels, were unsightly. There is a continuing need for an aesthetic roof design that provides effective solar power for home electrical needs while being cost effective.

SUMMARY

The present disclosure describes a glass roof shingle including a shingle cover layer made of a laminated glass having a core layer and at least one cladding layer adjacent to the core layer, where the core layer has a stress state that is opposite to that of the at least one cladding layer. A shingle base layer is disposed underneath the shingle cover layer. Opposing surfaces of the shingle cover layer and shingle base layer define a cavity. A seal area is formed between the shingle base layer and the shingle cover layer and around the cavity to control ingress of moisture into the cavity. A photovoltaic module may be disposed within the cavity.

In an aspect (1), the disclosure provides a photovoltaic roof shingle comprising a shingle cover layer made of a glass having a thickness from about 0.7 mm to about 7 mm; a shingle base layer made of a glass having a thickness from about 100 microns to 2.5 mm disposed underneath the shingle cover layer, wherein opposing surfaces of the shingle cover layer and the shingle base layer define a cavity; a photovoltaic module disposed within the cavity, the photovoltaic module comprising an array of solar cells, the array of solar cells being configured for use at a select wavelength range; and a seal area formed between the shingle base layer and the shingle cover layer and around the cavity to control ingress of moisture into the cavity.

In an aspect (2), the disclosure provides the roof shingle of aspect (1), wherein the shingle cover layer comprises a core-clad glass material, the core-clad glass material comprising two cladding layers with a core layer disposed between the two cladding layers, wherein the core layer has a coefficient of thermal expansion and the cladding layers each have a coefficient of thermal expansion that is different than the core layer coefficient of thermal expansion. In an aspect (3), the disclosure provides the roof shingle of aspect (2), wherein the coefficient of thermal expansion of the core layer is greater than the coefficient of thermal expansion of the at least one cladding layer. In an aspect (4), the disclosure provides the roof shingle of aspect (2), wherein at least one cladding layer has a thickness in a range from 20 microns to 1 mm. In an aspect (5), the disclosure provides the roof shingle of aspect (2), wherein the core layer has a thickness in a range from about 2 mm to about 7 mm.

In an aspect (6), the disclosure provides the roof shingle of aspect (1), wherein the shingle cover layer comprises a chemically tempered glass having a depth of compression of at least 100 microns and a surface compressive stress of at least 300 MPa. In an aspect (7), the disclosure provides the roof shingle of aspect (1), wherein the shingle cover layer comprises a thermally treated glass having a surface compressive stress of at least 50 MPa. In an aspect (8), the disclosure provides the roof shingle of aspect (1), wherein the shingle cover layer comprises a glass laminate, wherein the glass laminate comprises at least two glass layers having different coefficients of thermal expansion that are laminated together by a non-glass material.

In an aspect (9), the disclosure provides the roof shingle of aspect (1), wherein the photovoltaic module comprises a crystalline silicon photovoltaic module. In an aspect (10), the disclosure provides the roof shingle of aspect (1), wherein the photovoltaic module further comprises a polymer sheet covering a surface of the array of solar cells and disposed between the photovoltaic module and the shingle cover layer. In an aspect (11), the disclosure provides the roof shingle of aspect (1), further comprising a thin film layer formed on a top surface of the shingle cover layer. In an aspect (12), the disclosure provides the roof shingle of aspect (1), wherein at least one of a top surface and a bottom surface of the shingle cover layer is contoured. In an aspect (13), the disclosure provides the roof shingle of aspect (1), wherein the shingle cover layer has an upper surface and at least a part of the upper surface of the shingle cover layer incorporates glass particles. In an aspect (14), the disclosure provides the roof shingle of aspect (1), wherein the glass particles have a root mean square average size of the glass particles, along their longest dimension, from about 300 microns to about 2 mm. The glass roof shingle of claim 13, wherein the glass particles are thermally fused with the shingle cover layer.

The foregoing general description and the following detailed description are exemplary of the invention and are intended to provide an overview or framework for understanding the nature of the invention as it is claimed. The accompanying drawings are included to provide further understanding of the invention and are incorporated in and constitute a part of this specification. The drawings illustrate various embodiments of the invention and together with the description serve to explain the principles and operation of the invention.

BRIEF DESCRIPTION OF DRAWINGS

The following is a description of the figures in the accompanying drawings. The figures are not necessarily to scale, and certain figures and certain views of the figures may be shown exaggerated in scale or in schematic in the interest of clarity and conciseness.

FIG. 5A is an isometric drawing of a solar glass roof shingle including multiple photovoltaic modules.

FIG. 5B is a cross-section of a solar glass roof shingle including multiple photovoltaic modules.

Figure 1:
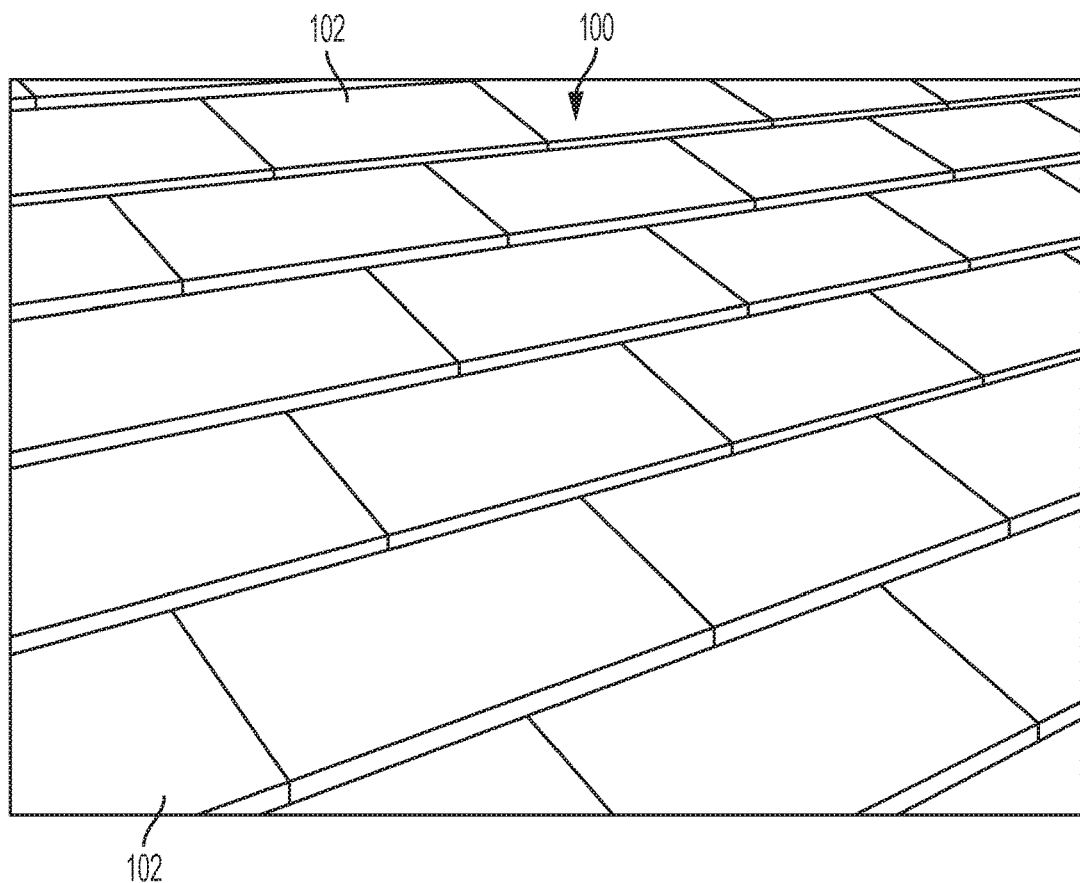
FIG. 1 shows a section of an array of glass roof shingles on a roof

The following reference characters are used in this description and the accompanying drawing figures:

100—Glass roof shingle array
102—Glass roof shingle
200—Solar glass roof shingle
200A—Non-solar glass roof shingle
200'—Solar glass roof shingle (alternative embodiment)
200"—Adjacent glass roof shingle
202—Shingle cover layer
202A—Sop surface of the shingle cover layer
202A1—First flat surface section of top surface of the shingle cover layer
202A2—Second flat surface section of top surface of the shingle cover layer
202A11—Flat surface section of top surface of the shingle cover layer covered with glass particles
202B—Bottom surface of the shingle cover layer
202B1—First flat surface section of bottom surface of the shingle cover layer
202B2—Second flat surface section of bottom surface of the shingle cover layer
202B11—Flat surface section of top surface of the shingle cover layer that is uncoated and covered by adjacent glass shingle
202'—Shingle cover layer (alternative embodiment)
204—Shingle base layer
206—PV module
207—Inner surface of the shingle cover layer
208—Inner surface of the shingle cover layer
210—Cavity
210'—Area of the shingle cover layer corresponding to the cavity
211—Non-glass support structure
211A—Shingle support structure
211B—Non-glass support structure PV region
212—Seal area
212'—Seal area (alternative embodiment)
213—Cutout region
215—Edge
216—Upper encapsulation layer
218—Lower encapsulation layer
220—Seal
222—Thin film layer
222A—Thin film transparent section
222B—Thin film non-transparent section
222C—Thin film transparent section (alternative embodiment)
222D—Thin film non-transparent section (alternative embodiment)
224—Backside thin film layer
300A—Core-clad glass
302A—Top cladding layer
304A—Bottom cladding layer
306A—Glass core layer
308A—Seam
310A—Side edge
300B—Core-clad glass (alternative embodiment)
302B—Top cladding layer (alternative embodiment)
304B—Bottom cladding layer (alternative embodiment)
306B—Glass core layer (alternative embodiment)
310B—Side edge (alternative embodiment)
300C—Core-clad glass (alternative embodiment)
302C—Top cladding layer (alternative embodiment)
304C—Bottom cladding layer (alternative embodiment)
306C—Glass core layer (alternative embodiment)
310C—Side edge (alternative embodiment)
300D—Core-clad glass (alternative embodiment)
302D—Top cladding layer (alternative embodiment)
304D—Bottom cladding layer (alternative embodiment)
306D—Glass core layer (alternative embodiment)
310D—Side edge (alternative embodiment)
300E—Core-clad glass (alternative embodiment)
302E—Top cladding layer (alternative embodiment)
304E—Bottom cladding layer (alternative embodiment)
306E—Glass core layer (alternative embodiment)
308E—Seam
310E—Side edge (alternative embodiment)
300F—Core-clad glass (alternative embodiment)
302F—Top cladding layer (alternative embodiment)
306F—Glass core layer (alternative embodiment)
302K—Core laminate layer
306K—Top laminate layer
307K—Bottom laminate layer
308K—Adhesive layer
400A—First flat surface
400B—Second flat surface
402—Sloping surface
404—Third flat surface
406—Front beveled edge
408—Back beveled edge
410—Slot
412—Pocket
414—Smaller slot
416—Rib
418—Post
420—Channel
422—Pocket (alternative embodiment)
424—Shingle base layer outline
426—Curved surface
428—Curved surface (alternative embodiment)
430—Curved surface (alternative embodiment)
500—Roof
502—Clamp 504—Roof support
506—Roof interlayer
508—Roof sheathing
510—Optional interlayer
512—Interlayer material
701—Compression region of tempered glass
703—Tension region of tempered glass

DETAILED DESCRIPTION

In the following detailed description, numerous specific details may be set forth in order to provide a thorough understanding of embodiments of the invention. However, it will be clear to one skilled in the art when embodiments of the invention may be practiced without some or all of these specific details. In other instances, well-known features or processes may not be described in detail so as not to unnecessarily obscure the invention. In addition, like or identical reference numbers may be used to identify common or similar elements.

The disclosure relates to photovoltaic roof designs that utilize a shingle that is at least partially made of glass in order to allow for integration of the photovoltaic cell into the roof such that the photovoltaic system is less noticeable and more aesthetically pleasing from an architectural standpoint. Current photovoltaic systems typically involve the addition of bulky photovoltaic panels that are placed on top of the existing roof structure. These panels add additional weight to the roof and can disrupt the architectural flow of the building, especially in the case of traditional single-family homes or architecturally important structures. Alternative designs have been considered, but have seen little adoption due to low efficiencies, high costs, and a continued lack of aesthetic appeal. The embodiments in the present disclosure solve one or more of these problems by providing a shingle design that adds photovoltaic modules into the shingle itself, thus removing the need for the addition of unsightly traditional photovoltaic panels and allowing for seamless integration of PV into the overall architectural design of the building.

Photovoltaic roof designs as embodied herein, will generally comprise two types of roof shingles—those incorporating a photovoltaic module ("solar") or cell and "blank" or "non-solar" shingles that do not incorporate a photovoltaic module. The need for blank shingles is because not all surfaces and areas of a roof are going to be optimal for PV use, due to angle relative to the sun or proximity to the edge of the roof or other roof structures. FIG. 1 shows an illustrative arrangement of glass roof shingles 102 on a roof. Each glass roof shingle 102 in the array 100 of FIG. 1 may be a solar glass roof shingle or a non-solar glass roof shingle. In some embodiments, there is no outward distinction between a solar glass roof shingle and a non-solar glass roof shingle, allowing the appearance of the roof to be uniform and aesthetically pleasing when solar and non-solar glass roof shingles are assembled together on the roof. At the same time, a customized power solution can be provided by installing only the number of solar glass roof shingles needed on the roof, where the remaining glass roof shingles on the roof can be non-solar. This can have the effect of reducing the overall cost of providing a solar solution.

Figure 2A:
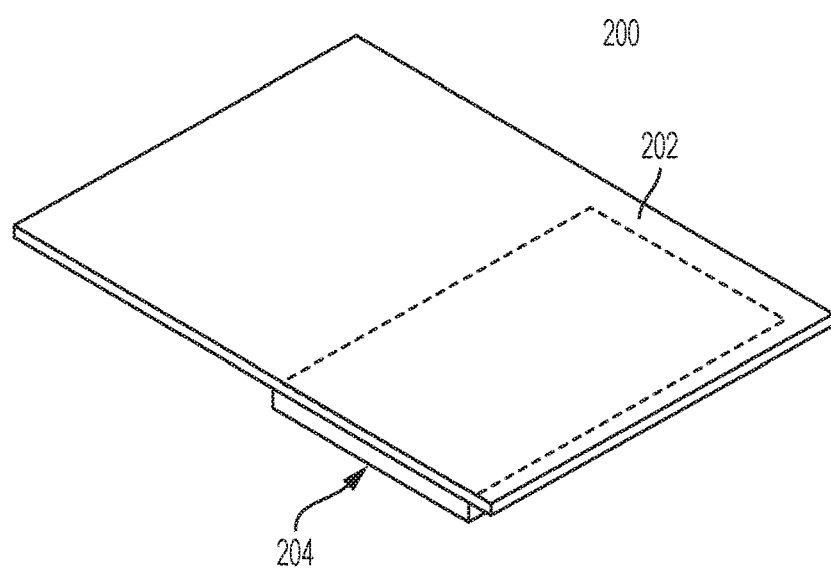
FIG. 2A is an isometric drawing of a glass roof shingle as disclosed herein.

FIG. 2A shows an embodiment of a solar glass roof shingle 200. The solar glass roof shingle 200 can generally be thought of as a sandwich structure comprising a top substrate, the shingle cover layer 202 and a bottom substrate, the shingle base layer 204 that sandwich between them the photovoltaic module (not shown in FIG. 2A). While the shingle cover layer is shown as a rectangular structure have a smooth upper surface, embodiments can have alternate shapes (example embodiments shown in FIGS. 8-8M and FIGS. 9A-9D, described below) and can incorporate textures or patterns on one or more surfaces, such as slate/stone, wood, etc. These shapes and textures can be incorporated into the glass during the forming process by rolling, pressing, or other known means.

Figure 2C:
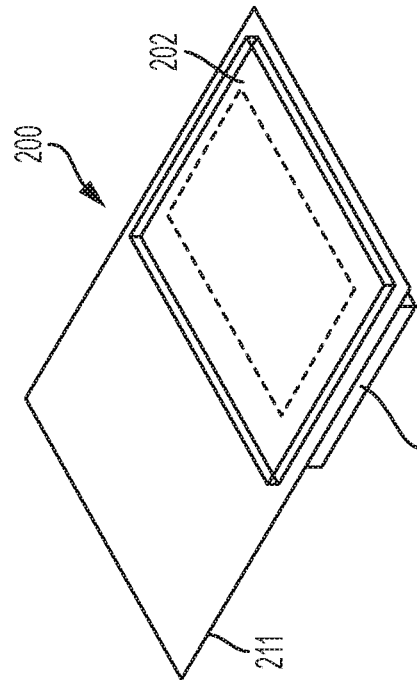
FIGS. 2B-2D are isometric drawings of alternative embodiments of a glass roof shingle.
Figure 2E:
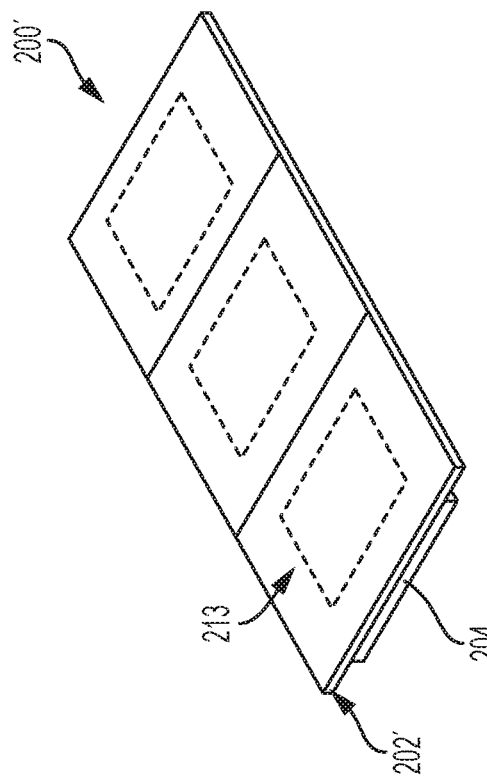
FIG. 2E is an isometric drawing of an embodiment of a glass three-shingle design.
Figure 2B:
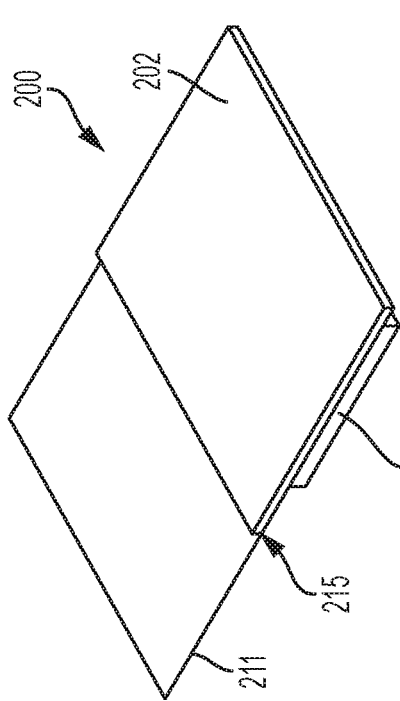
Figure 2D:
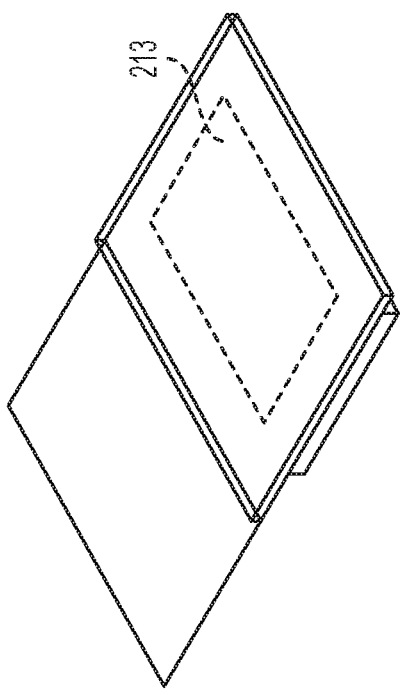

An alternative embodiment is shown in FIG. 2B, wherein the solar glass roof shingle comprises the shingle cover layer 202, the shingle base layer 204, and a support structure, 211, The support structure in this case is a non-glass material that is used to provide support to the shingle and as a means of adhering the shingle to the roof. For example, the support structure 211 can be made of traditional asphalt roofing materials, metal, polymer, or even a wood or wood composite. The embodiment in FIG. 2B shows the support structure adhered to the cover and/or base layer on one side, at edge 215. FIG. 2C provides an alternative embodiment where the cover layer 202 is smaller than the overall shingle size and the support structure 211 surrounds the cover layer 202. The shingle cover layer 202 and shingle base layer 204 can be laminated on the support structure 211, either above or below, or with the support structure incorporated between the cover layer and the base layer (as shown in FIG. 2D). In some embodiments, the support structure 211 can have a cutout region 213 for the photovoltaic cell, the shingle cover layer, and/or the shingle base layer.

While FIG. 2A shows a single solar roof shingle, current designs for asphalt shingles typically have three shingles attached together. In a similar manner, the disclosure contemplates alternative embodiments wherein multiple solar roof shingles are combined either via a single cover layer, single base layer, or single support structure. For example, as shown in FIG. 2E, a solar roof shingle 200' may comprise three roof shingles that have a single cover layer 202' and three regions for the photovoltaic cell, 210. In some embodiments the solar roof shingle comprises multiple shingles linked together. In such embodiments, there can be "n" linked shingles, where n is an integer greater than 1. In some such embodiments, the shingles may be linked via the support structure 211, the base layer 204, or the cover layer 202', and further, in some embodiments, may be mechanically separated such that the number of linked solar shingles is reduced by an integer amount. Throughout the disclosure, where a single solar shingle is shown or described, it is contemplated that such designs or embodiments can be equally applied to a multi-shingle embodiments as well, and vice versa.

Figure 3A:
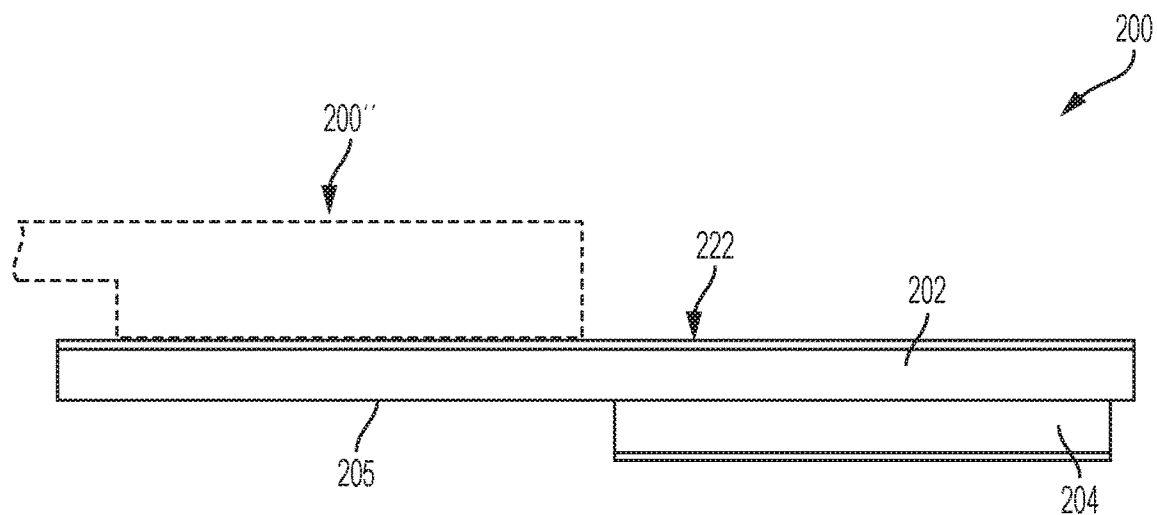
FIG. 3A is a side view of a solar glass roof shingle according to some embodiments.
Figure 3B:
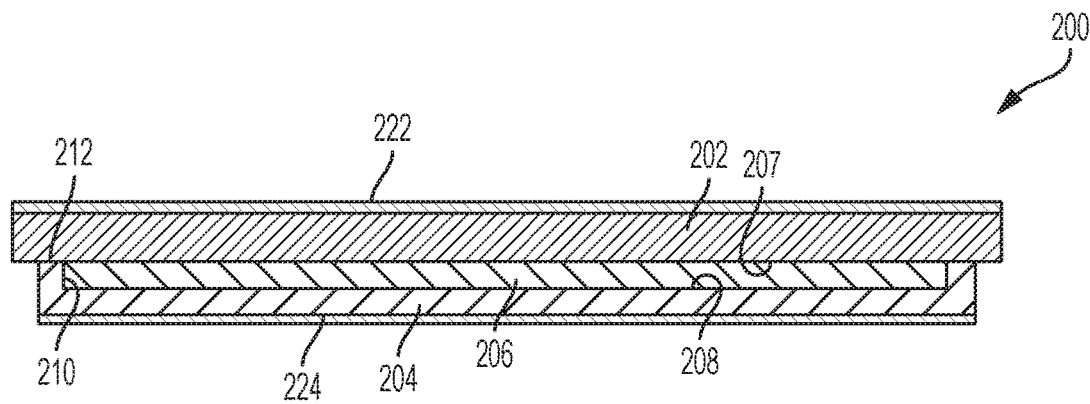
FIG. 3B is a cross-section of a solar glass roof shingle according to some embodiments.

FIG. 3A shows a side view of the solar glass roof shingle 200. FIG. 3B shows a cross-section of the solar glass roof shingle 200. Referring to FIG. 3B, the solar glass roof shingle 200 includes a shingle cover layer 202, a shingle base layer 204, and a photovoltaic (PV) module 206. When the glass roof shingle 200 is installed on a roof, the shingle cover layer 202 will be the sun-side of the glass roof shingle, and the shingle base layer 204 will be the roof-side of the glass roof shingle. Although the solar glass roof shingle 200 is shown as including one PV module 206, it should be noted that in other embodiments the solar glass roof shingle 200 may include multiple PV modules 206. The shingle base layer 204 lies underneath the shingle cover layer 202 and is coupled to the shingle cover layer 202. As shown in FIG. 3A, the shingle cover layer 202 may overhang or overlap the shingle base layer 204 to form a mounting flange 205 (FIG. 3A). The mounting flange 205 may be used to mount the glass roof shingle 200 on a roof. For example, the mounting flange 205 may be received in a clamp on the roof. The mounting flange 205 may also support an adjacent glass roof shingle 200". As noted above, in some embodiments that comprise a support structure 211, the mounting flange region 205 is replaced with the support structure. In such embodiments, the adjacent glass roof shingle 200" can cover partially or fully the support structure 211 and be supported by the same.

The shingle cover layer 202 alone, or in combination with the shingle base layer 204 and/or the support structure 211, can provide structural integrity for the solar glass roof shingle 200. Additionally, the shingle cover layer 202 and/or solar glass roof shingle 200 needs to be sufficiently strong to undergo the stresses of hail impact, snow load, and potentially walking on as well as meet the standard roof ratings. Such ratings include hail impact resistance (FM 4473 (class 4)), roof fire resistance (UL 790 (class A)), roof wind resistance (ASTM D2161 (class F)), plus photovoltaic module rating (UL 1703) and photovoltaic mounting (UL 2703 (30 PSF)). In order for the glass to have sufficient strength to deal with these stresses, in some embodiments it is necessary to strengthen the glass in some manner. Strengthening methods are well known in the art and include thermal or chemical tempering of the glass, formation of a core-clad glass structure wherein different glasses are combined in a layered manner and the difference in the coefficient of thermal expansion (CTE) between the glasses provides a compressive stress on the surface of the glass, or lamination of glasses (or glass with other transparent materials, such as polymers) with different CTEs in order to obtain a surface compressive stress.

In FIG. 3B, the inner surfaces 207, 208 of the shingle cover layer 202 and shingle base layer 204, respectively, define a cavity 210 between the shingle cover layer 202 and the shingle base layer 204. The PV module 206 is disposed within the cavity 210. In some embodiments, a seal area 212 is formed between the shingle cover layer 202 and the shingle base layer 204. The seal area 212 circumscribes the cavity 210 and prevents or controls ingress of moisture into the cavity 210. Although not shown, the shingle base layer 204 may include holes through which the terminals of the PV module 206 can extend out of the cavity 210. This will allow electrical connections to be made to the PV module 206. The holes can be sealed around the terminals to prevent moisture ingress into the cavity 210.

Figure 4:
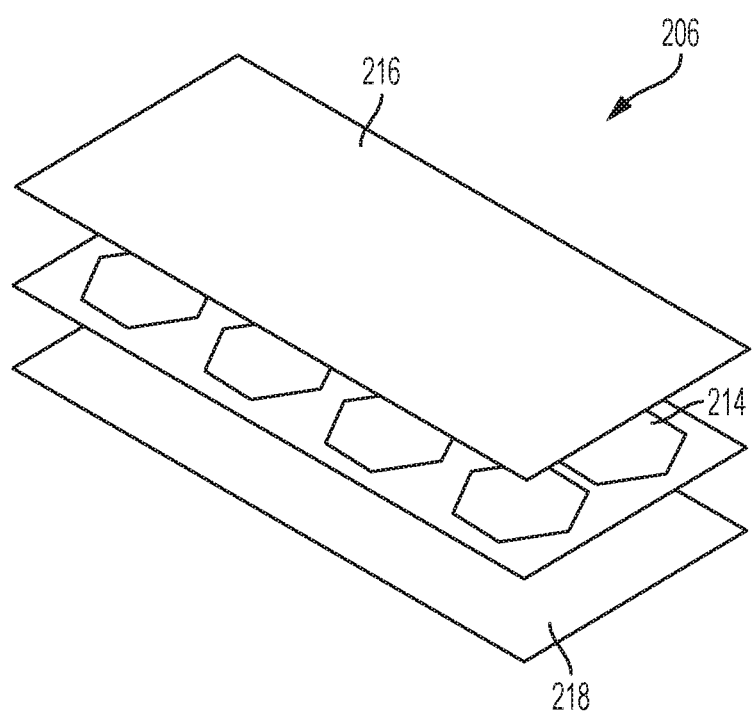
FIG. 4 shows a solar glass roof shingle including multiple photovoltaic modules.

The term "photovoltaic module" or "PV module" will generally be understood to mean a package of solar cells configured to generate and supply electricity. In general, as shown in FIG. 4, the PV module 206 includes an array of solar cells 214. The solar cells 214 may be made from silicon, for example. In some embodiments, the array of solar cells 214 may be encapsulated between polymer or glass layers 216, 218. The layers 216, 218 may seal the solar cells 214 from moisture. The top layer 216, which is the layer that will be between the array of solar cells 214 and the shingle cover layer (202 in FIG. 3B), should be made of a material that is optically transparent in the wavelength range to be used by the solar cells 214. The bottom layer 218, which is the polymer layer that will be between the array of solar cells 214 and the shingle base layer (204 in FIG. 3B), may or may not be optically transparent.

Returning to FIG. 3B, the shingle cover layer 202 is made of a material that is optically transparent in the wavelength range to be used by the solar cells in the PV module 206. This wavelength range may be, for example, from 350 nm to 1200 nm. In another example, the wavelength range may be from 400 nm to 1000 nm. In some embodiments, the shingle cover layer 202 is made of glass. In some embodiments, the shingle cover layer 202 may be made of a combination of glass and polymer. In some embodiments, the glass composition of the shingle cover layer 202 comprises one or more components that absorb light in the ultraviolet region of the electromagnetic spectrum, such as cerium, zinc, or titanium compounds (e.g., oxides and fluorides). UV absorption can be advantageous as the UV light can damage the photovoltaic module or components as well as the polymers and/or laminates in the solar shingle.

The shingle base layer 204 may be made of durable waterproof material. In some embodiments, the shingle base layer 204 may be made from polymer or glass or lightweight metal. In some embodiments, the shingle base layer 204 may have mechanical rigidity suitable for supporting the PV module 206. For example, the shingle base layer 204 may be made of hard plastic, glass, or aluminum. In some embodiments, the shingle base layer is a glass such that a glass-glass sandwich is formed around the photovoltaic device, creating a significant barrier to oxygen and moisture ingress.

The PV module 206 could be provided as a separate unit that is disposed within the cavity 210 or may be grown on the underside (inner surface 207) of the shingle cover layer 202 (or base layer 204) such that when the shingle cover layer 202 and shingle base layer 204 are assembled together, the PV module 206 will be disposed within the cavity 210.

The seal area 212 between the shingle cover layer 202 and the shingle base layer 204 may be formed using a variety of methods. In one example, as shown in FIG. 2B, contacting surfaces of the shingle cover layer 202 and the shingle base layer at the seal area 212 are glued, fused, or otherwise joined together to form a sealed seam.

Figure 3C:
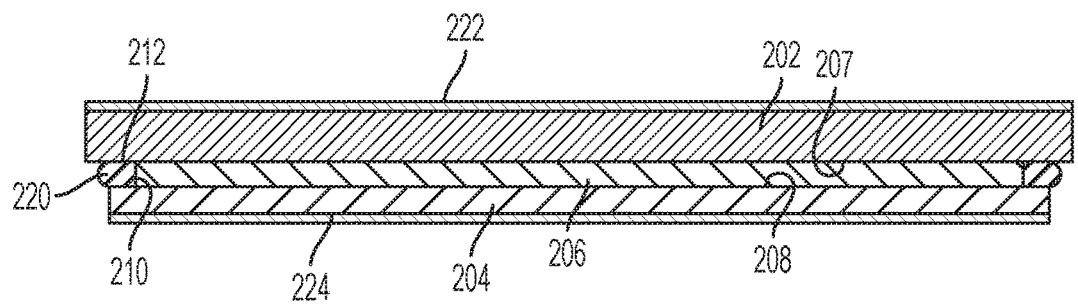
FIG. 3C is a cross-section of a solar glass roof shingle according to other embodiments.

In another example, as shown in FIG. 3C, a seal 220 is formed in a gap between the shingle cover layer 202 and the shingle base layer 204 at the seal area 212. The seal 220 may be, for example, a polymer sealant or glass frit. In general, the type of seal 220 would be selected based on the material of the shingle cover layer 202 and shingle base layer 204. For example, if both the shingle cover layer 202 and shingle base layer 204 are made of glass, a glass frit may be suitable as a seal. On the other hand, if one of the shingle cover layer 202 and shingle base layer 204 is made of polymer, a polymer sealant may be suitable as a seal.

Returning to FIG. 2B, a thin film layer 222 may be formed on the top surface of the shingle cover layer 202. The thin film layer 222 may be decorative and/or functional. Regardless of whether the thin film layer 222 is decorative and/or functional, the thin film layer 222 should allow transmission of light to the shingle cover layer 202. The thin film layer 222 may be formed on the shingle cover layer 202 using any suitable process. For example, the thin film layer 222 may be formed via a vapor deposition process or provided in form of a curable ink that can be deposited on a surface using methods such as screen printing, inkjet printing, and the like and then cured.

In one embodiment, the thin film layer 222 may act as a bandpass filter that allows certain wavelengths to pass through to the shingle cover layer 202. In one example, the thin film layer 222 may be configured to allow wavelengths less than 400 nm through. In another example, the thin film layer 222 may be configured to allow wavelengths less than 1000 nm through. In yet another example, the thin film layer 222 may be configured to allow wavelengths between 400 nm and 1000 nm through.

In another embodiment, the thin film layer 222 may function as a privacy filter or light control film. In general, the privacy filter film includes alternating arrangement of transparent and non-transparent areas configured to limit the viewing angle of an image plane when placed between the viewer and the image plane. In one embodiment, the thin film layer 222 may be configured such that the glass roof shingle 200 will appear opaque when viewed from the ground level but transparent when viewed from peak sun. Such a design may be obtained from one or more coatings on the shingle cover layer or by chemical or physical modification of the glass. For example, glass materials are known in the art that can be selectively crystallized via their photosensitivity. Such glasses could be selectively patterned and cerammed to allow for light control (see, e.g., U.S. Publ. No. 2017/0210665, herein incorporated by reference).

Figure 4A:
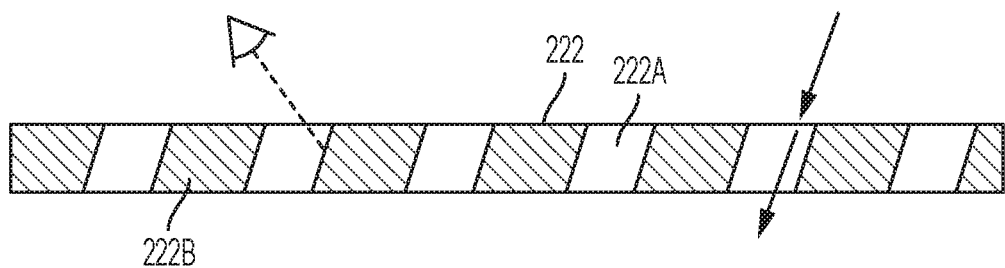
FIG. 4A shows a thin film layer having transparent and opaque or colored sections.
Figure 4B:
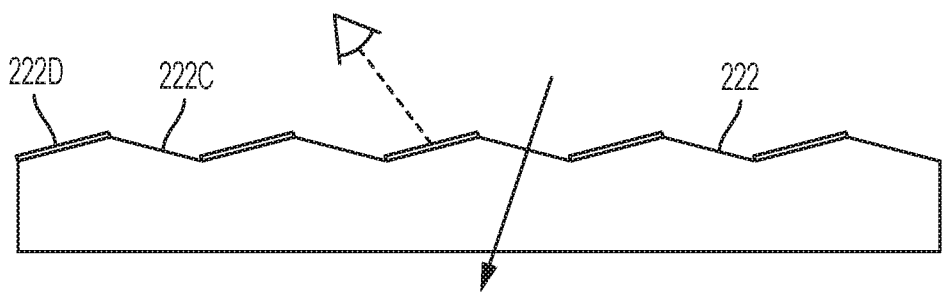
FIG. 4B shows a textured glass shingle having transparent and opaque or colored sections.

In FIG. 4A, the thin film layer 222 has transparent sections 222A and non-transparent sections 222B in alternating arrangement. The transparent sections 222A will allow transmission of light, while the non-transparent sections 222B will block transmission of light. Such transparent and non-transparent areas 222C, 222D, respectively, are also shown in FIG. 4B. In FIG. 4B, the transparent and non-transparent areas 222C, 222D of the thin film layer 222 are formed at the surface of the thin film layer 222, whereas in FIG. 4B, the transparent and non-transparent sections 222A, 222B extend through the thickness of the thin film layer 222.

Returning to FIG. 2B, a thin film layer 224 may also be formed on the shingle base layer 204. The thin film layer 224 may function as an interlayer between the glass roof shingle and another surface, such as another glass roof shingle, when the glass roof shingles are installed on a roof. Such a layer may function as a hard coat, an anti-friction coat, or in some other capacity.

The shingle cover layer 202 may be made of a clear material or a colored material. If the shingle cover layer 202 is clear, then the PV module 206 underlying the shingle cover layer 202 will provide the color of the glass roof shingle. In some embodiments, the combination of the shingle cover layer 202 and the photovoltaic module can provide the desired color for the shingle 200. In other embodiments, the combination of the shingle cover layer 202 or the support structure 211, and the photovoltaic module can provide the desired color for the shingle 200. For example, if the support structure 211 is an asphalt layer, it would in large part provide the proper coloring for the overlaying shingle cover layer 202 even if the cover layer was transparent. In some embodiments, the top layer (216 in FIG. 3) of the PV module 206 may have a desired color. It may also be possible to impart color to the glass roof shingle 200 using the thin film layer 222 on the shingle cover layer 202.

FIGS. 5A and 5B provide an example embodiment of a solar glass roof shingle 200 incorporating multiple PV modules 206 utilizing a single shingle cover layer 202 and a single shingle base layer 204, wherein the PV modules are separated from each other by seal area 212', which can be a polymer or glass frit or other material. This may reduce the overall number of glass roof shingles to be installed on a roof, which can reduce the installation time. The cavity 210 of the glass roof shingle 200 can be made large enough to accommodate a desired number of PV modules 206. In the example shown in FIG. 5B, three PV modules 206 are disposed in the cavity 210. The PV modules 206 may be connected together to form a PV panel.

Figure 6A:
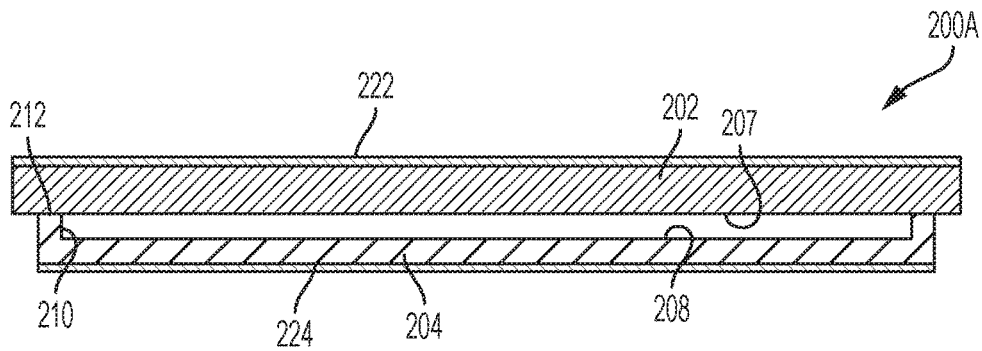
FIGS. 6A and 6B are cross-sections of non-solar glass roof shingle designs according to some embodiments.
Figure 6B:
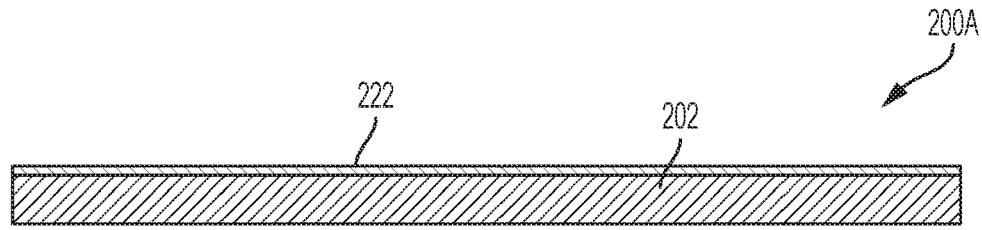

Referring to FIG. 6A, in some embodiments, a non-solar glass roof shingle 200A is essentially a solar glass roof shingle (200 in FIG. 2B) without a PV module (206 in FIG. 2B). In the case of the non-solar glass roof shingle 200A, the cavity 210 defined by the inner surfaces 207, 208 of the shingle cover layer 202 and the shingle base layer 204, respectively, may be empty or may contain a filler material. The non-solar glass roof shingle 200A may have the optional thin film layers 222, 224 on the shingle cover layer 202 and shingle base layer 204, respectively. Alternatively, as shown in FIG. 6B, the non-solar glass roof shingle 200A may simply comprise the shingle cover layer 202 or a layer similar in design to the shingle cover layer as the base layer 204 is essentially unnecessary when no photovoltaic module 206 is not present. In general, it is desired that the outward appearance and structure of the non-solar glass roof shingle 200A should be similar to that of the solar glass roof shingle (200 in FIG. 2A), with the exception that the non-solar glass roof shingle 200A will not include a PV module.

One of the desired properties of the shingle cover layer 202 may be that the shingle cover layer 222 is essentially shatterproof as it may be exposed to impact forces such as from hail and the like. Another of the desired properties of the shingle cover layer 202 may be that the shingle cover layer 222 is stable when exposed to prolonged heating from the sun. Another of the desired properties of the shingle cover layer 222 may be low weight, which would allow an overall low weight glass roof shingle. Another of the desired properties of the shingle cover layer 222 may be low permeation to moisture and gas.

Figure 7A:
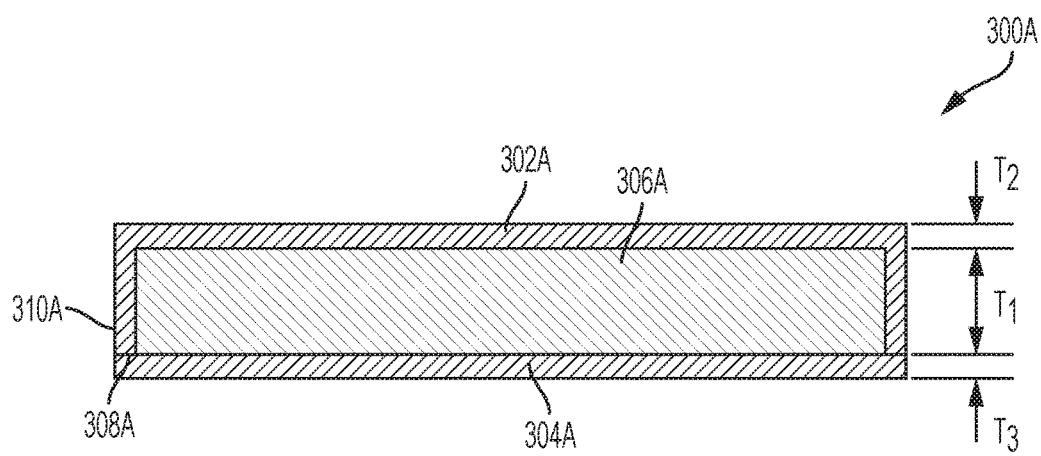
FIGS. 7A-7I show various types of glass "structures" for a shingle cover layer of a glass roof shingle.

In one embodiment, the shingle cover layer 202 comprises a glass including a core layer made of glass and having at least one surface contiguous with a cladding layer made of glass compositionally different that the core glass such that the state of stress in the core layer is different from the state of stress in the cladding layer. In some embodiments, the core layer is sandwiched between to cladding layers. FIG. 7A provides an example of a glass core-clad design wherein 302A and 304A are clad layers and 306a is the core layer. In some embodiments, the cladding layer is under compression, while the core layer is under tension. In some embodiments, the different state of stress in the core layer and cladding layer is achieved by selecting the average coefficient of thermal expansion (CTE) of the core layer to be different from the average CTE of the cladding layer(s). In some embodiments, the average CTE of the core layer is greater than the average CTE of the cladding layer. In some embodiments, the core layer is much thicker than the cladding layer. The thicknesses and average CTEs of the core layer relative to the cladding layer can be selected to achieve a desired mechanical strength and resistance to impact damage of the core-clad glass in a relatively thin cross-section. In some embodiments, the thickness of the core-clad glass ranges from 2 mm to 7 mm. In some embodiments, the core layer has a thickness of from about 2 mm to 5 mm. In some embodiments, the cladding layer has a thickness of from about 2 microns to 1 mm. In some embodiments, the cladding layers are present on both side of the core layer and can have the same or different thicknesses. Further, the cladding layers can be compositionally different from each other and have different CTEs from each other and from the core layer.

In some embodiments, the glass used in the core layer and the cladding layer(s) has optical transparency at least down to the ultraviolet wavelength range or a wavelength range to be used by solar cells in a PV module included in the glass roof shingle. If the glass roof shingle is of the non-solar type, then optical transparency may not be that important.

In some embodiments, the core layer and cladding layer(s) of the core-clad glass may each be made of soda lime glass. A high CTE soda lime glass may be used in the core layer, and a low CTE soda lime glass may be used in the cladding layer(s). It is also possible to use other types of glasses, bearing in mind that the glass should be transparent in the wavelength use range of the solar cells of the PV module, if the glass roof shingle is of the solar type.

Various non-exhaustive examples of core-clad glass structures for the shingle cover layer are disclosed in FIGS. 7A-7G and explained below. The examples in FIGS. 7A-7E use two cladding layers, whereas the examples in FIGS. 7F and 7G use a single contiguous cladding layer. Core-clad glass structures wherein the cladding layer is present on only one of the faces of the clad layer are also contemplated, but not shown. The various shapes of the cladding layer can be made as a function of the forming process of the shingle cover layer and of the width of the core and cladding layers. For example, pressing or rolling processes to form the shingle cover glass layer allow for the pinching or rolling of the glass edge such that the cladding layer completely surrounds the core layer, thereby protecting the edges such that the edge is not a weak point due to the core layer being exposed.

FIG. 7A shows an example core-clad glass 300A having a top cladding layer 302A, a bottom cladding layer 304A, and a core layer 306A. The core layer 306A is disposed between the top cladding layer 302A and the bottom cladding layer 304A. The top cladding layer 302A has a general U-shape, and the bottom cladding layer 304A has a flat shape. A seam 308A is formed between the top cladding layer 302A and the bottom cladding layer 304A at the side edge 310A of the core-clad glass 300A such that the core layer 300A is completely enclosed within the core-clad glass 300A and is not exposed at the side edge 310A of the core-clad glass 300A.

Each of the top cladding layer 302A, bottom cladding layer 304A, and core layer 306A is made of glass, as described above for the core-clad glass. In some embodiments, the CTE of the core layer 306A is selected to be different from the CTE of each of the top cladding layer 302A and the bottom cladding layer 304A. In one embodiment, the CTE of the core layer 306 is selected to be greater than the CTE of each of the top cladding layer 302A and the bottom cladding layer 304A. This may be achieved by the choice of glass used in the core and claddings. In one embodiment, the CTE of the top cladding layer 302A is the same as the CTE of the bottom cladding layer 304A. In another embodiment, the CTE of the top cladding layer 302A is different from the CTE of the bottom cladding layer 304A. The difference in CTEs between the layers of the core-clad glass 300A may be selected to achieve a desired impact damage resistance of the core-clad glass 300A.

In one embodiment, the thickness $T_1$ of the core layer 306A is larger than each of the thickness $T_2$ of the top cladding layer 302A and the thickness $T_3$ of the bottom cladding layer 304A. The thickness $T_2$ of the top cladding layer 306A may be the same as or different from the thickness $T_3$ of the bottom cladding layer 304A. The thicknesses of the cladding layers 302A, 304A and core layer 306A may be selected to achieve a desired mechanical strength of the core-clad glass 300A. In some embodiments, the thickness of the core-clad glass 300A, i.e., the sum of $T_1$, $T_2$, and $T_3$, may be in a range from 2 mm to 7 mm. The thickness of each of the cladding layers 302A, 304A may range from about 2 microns to 1 mm, with the core layer 306A contributing the remainder of the thickness of the core-clad glass 300A.

Figure 7B:
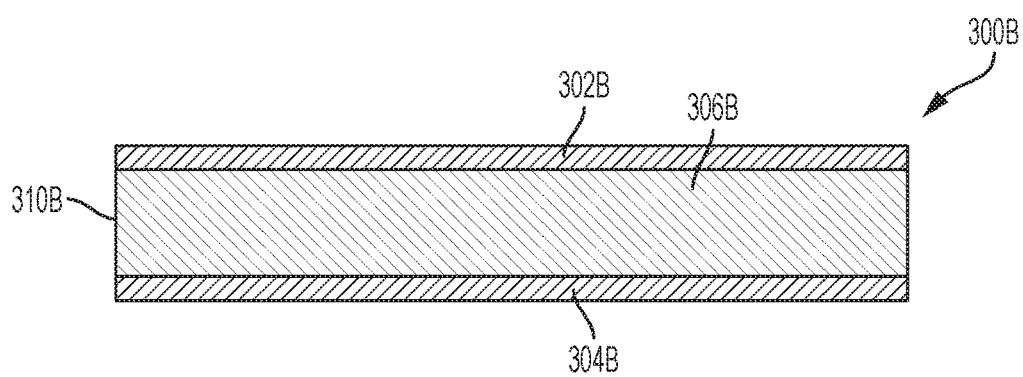

FIG. 7B shows an example core-clad glass 300B having a top cladding layer 302B, a bottom cladding layer 304B, and a core layer 306B. The core layer 306B is disposed between the top cladding layer 302B and the bottom cladding layer 304B. Both the top cladding layer 302B and the bottom cladding layer 304B have flat shapes, and a seam is not formed between the top cladding layer 302B and the bottom cladding layer 304B. The core layer 306B is fully exposed at the side edge 310B of the core-clad glass 300B but covered at the top and bottom by the cladding layers 302B, 304B. The top cladding layer 302B, bottom cladding layer 304B, and core layer 306B may have the same characteristics (in terms of glass composition, CTEs, and thicknesses) as described above for the corresponding top cladding layer 302A, bottom cladding layer 304A, and core layer 306A of the core-clad glass 300A.

Figure 7C:
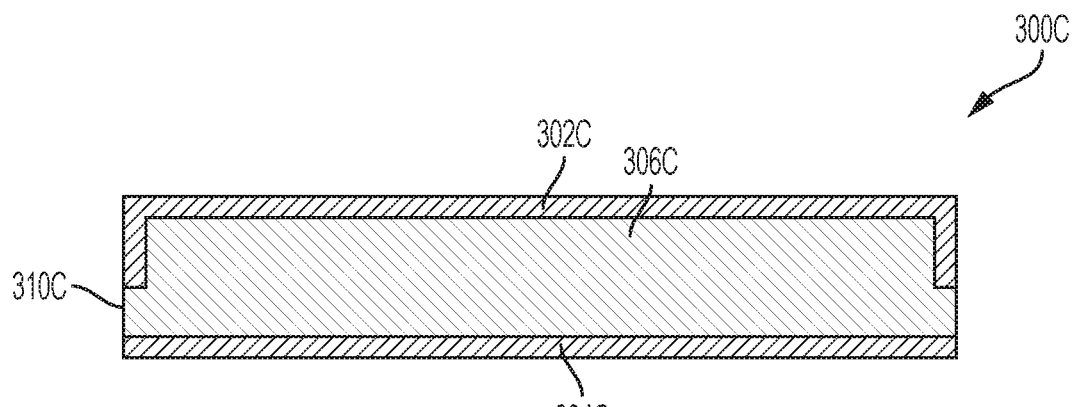

FIG. 7C shows an example core-clad glass 300C having a top cladding layer 302C, a bottom cladding layer 304C, and a core layer 306C. The core layer 306C is disposed between the top cladding layer 302C and the bottom cladding layer 304C. The top cladding layer 306C has a general U-shape, and the bottom cladding layer 304C has a flat shape. A seam is not formed between the top cladding layer 302C and the bottom cladding layer 304C at the side edge 310C of the core-clad glass 300C, leaving the core layer 306C partially exposed at the side edge 310C of the core-clad glass 300C. The top cladding layer 302C, bottom cladding layer 304C, and core layer 306C may have the same characteristics (in terms of glass composition, CTEs, and thicknesses) as described above for the corresponding top cladding layer 302A, bottom cladding layer 304A, and core layer 306A of the core-clad glass 300A.

Figure 7D:
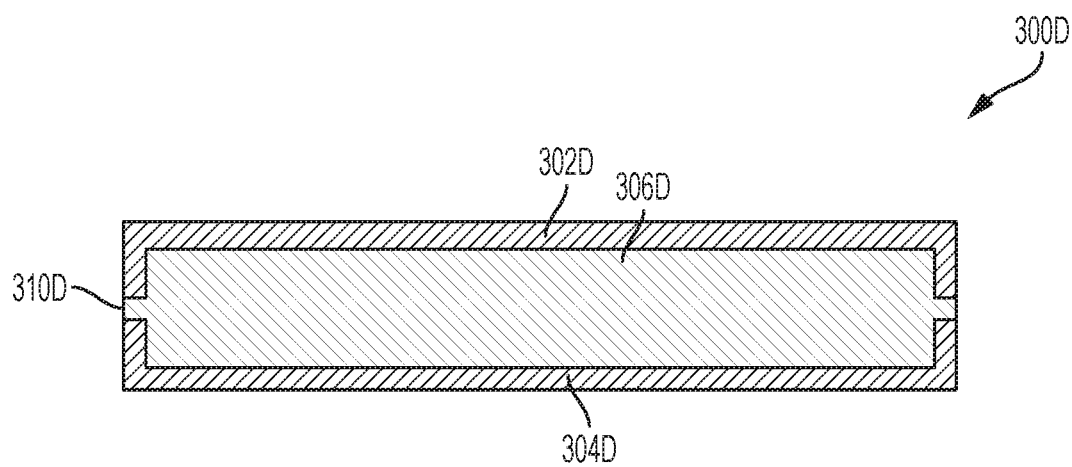

FIG. 7D shows an example core-clad glass 300D having a top cladding layer 302D, a bottom cladding layer 304D, and a core layer 306D. The core layer 306D is disposed between the top cladding layer 302D and the bottom cladding layer 304D. The top cladding layer 302D has a general U-shape, and the bottom cladding layer 304D has a general U-shape. A seam is not formed between the top cladding layer 302D and the bottom cladding layer 304C at the side edge 310D of the core-clad glass 300D, leaving the core layer 306D partially exposed at the side edge 310C of the core-clad glass 300D. The top cladding layer 302D, bottom cladding layer 304D, and core layer 306D may have the same characteristics (in terms of glass compositions, CTEs, and thicknesses) as described above for the corresponding top cladding layer 302A, bottom cladding layer 304A, and core layer 306A of the core-clad glass 300A.

Figure 7E:
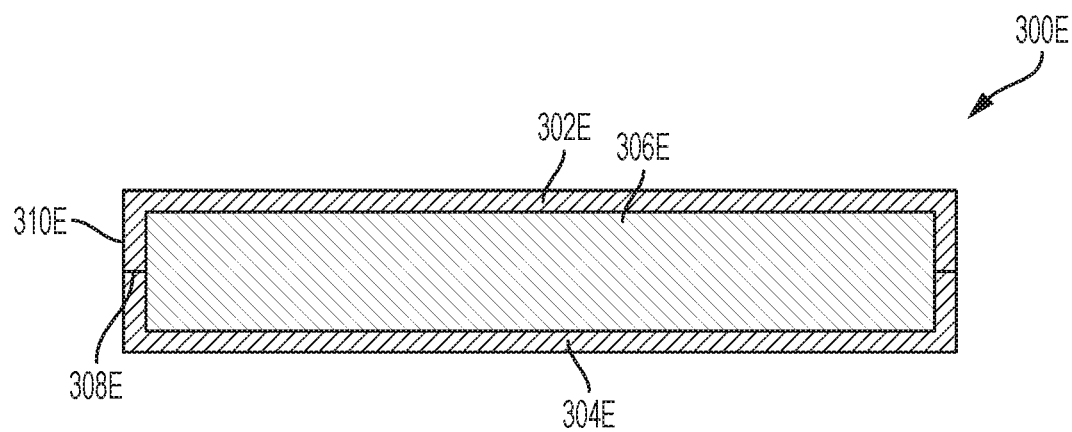

FIG. 7E shows an example core-clad glass 300E having a top cladding layer 302E, a bottom cladding layer 304E, and a core layer 306E. The core layer 306E is disposed between the top cladding layer 302E and the bottom cladding layer 304E. The top cladding layer 302E has a general U-shape, and the bottom cladding layer 304E has a general U-shape. A seam 308E is formed between the top cladding layer 302E and the bottom cladding layer 304E at the side edge 310E of the core-clad glass 300E such that the core layer 306 is completely enclosed within the core-clad glass 300E and is not exposed at the side edge 310 of the core-clad glass 300E. The top cladding layer 302E, bottom cladding layer 304E, and core layer 306E may have the same characteristics (in terms of glass compositions, CTEs, and thicknesses) as described above for the corresponding top cladding layer 302A, bottom cladding layer 304A, and core layer 306A of the core-clad glass 300A.

Figure 7F:
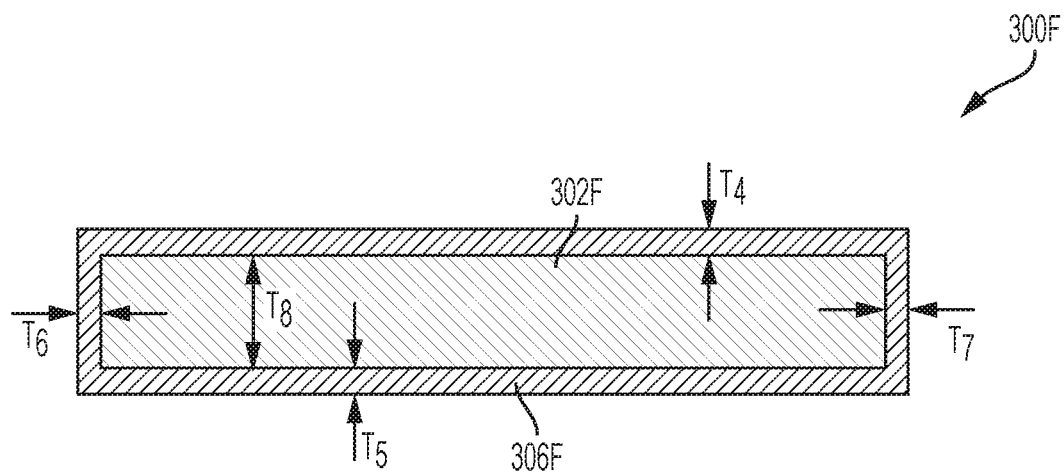
Figure 7G:
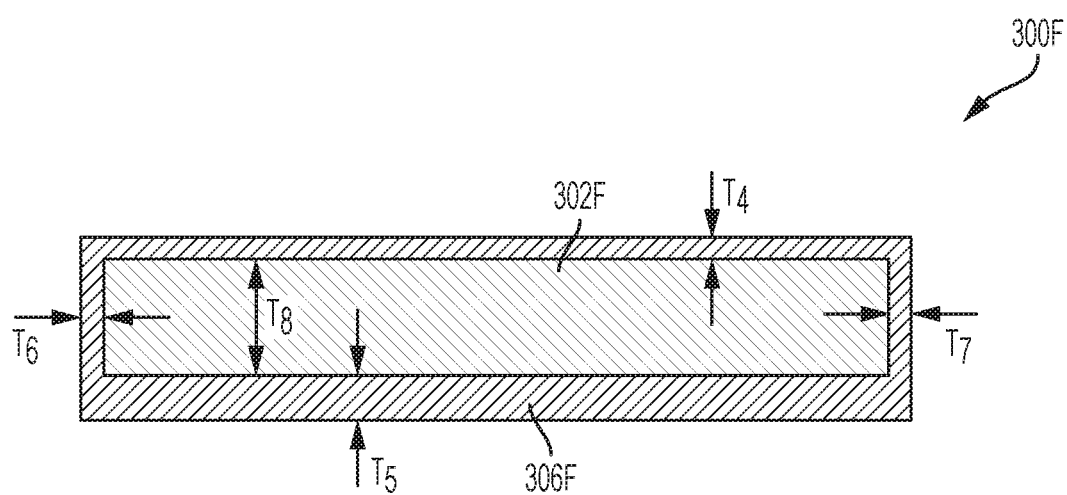

FIG. 7F shows an example core-clad glass 300F having a cladding layer 302F and a core layer 306F. The cladding layer 302F forms a complete envelope around the core layer 306F. This is possible wherein the cladding layer is formed via a down draw process wherein the cladding layer is drawn down completely around the core layer. The core layer 306F is contained within a cavity formed by the cladding layer 302F and is not exposed at the periphery of the core-clad glass 300F. The cladding layer 302F may have a uniform or non-uniform thickness along the periphery of the core layer 306F. The core layer 306F may be generally symmetrically disposed within the cladding layer 302F such that, for example, the thicknesses of opposing portions of the cladding layer 302F are the same. For example, the thicknesses $T_4$ and $T_5$ of the opposing top and bottom parts of the cladding layer 302F may be the same, and the thicknesses $T_6$ and $T_7$ of opposing side parts of the cladding layer 302F may be the same. In an alternate embodiment, such as shown in FIG. 7G, the core layer 306F may be generally asymmetrically disposed within the cladding layer 302F such that, for example, $T_4$ and $T_5$ are different.

As in the previous examples, the cladding layer 302F and core layer 306F are made of glass, as described above for the core-clad glass, and the CTE of the core layer 306F may be selected to be different from the CTE of the cladding layer 302F, or the CTE of the core layer 306F may be selected to be larger than the CTE of the cladding layer 302F. The difference in CTEs of the core layer 306F and cladding layer 302F may be selected to achieve a desired impact damage resistance of the core-clad glass 330F. Further, the thickness $T_8$ of the core layer 306F may be selected to be much larger than the thickness of the cladding layer 302F. The overall thickness of the core-clad glass 300F may be selected to achieve a desired mechanical strength of the core-clad glass 300F. In some embodiments, the thickness of the core-clad glass (measured in a direction from the top to the bottom of the core-clad glass) is in a range from 2 mm to 7 mm. The contribution of the cladding layer 302F to the thickness of the core-clad glass 300F may be in a range from 2 microns to 1 mm.

The core-clad glass may be made using any suitable core-clad glass forming process. In one embodiment, the core-clad glass is made from a continuous hot-forming process. This may involve melting glasses for the individual layers of the core-clad glass and then simultaneously fusing the glasses together to form a core-clad glass that can be formed into a desired shape by stamping or molding or other suitable shape forming process. Where the CTE of the core layer is selected to be greater than the CTE of the cladding layer, upon solidification of the core-clad glass, the difference in CTE will result in the cladding layer being in compression, thereby increasing the mechanical strength of the core-clad glass without the need to subject the core-clad glass to additional chemical or thermal tempering. It may also be possible to form a continuous core-clad glass sheet using continuous hot-forming or fusion-draw process, separating the continuous glass sheet into discrete glass sheets, and forming core-clad glass articles in the desired shape of the shingle cover layer from the discrete glass sheets. The forming into a desired shape may be achieved by any of molding, bending, machining, and the like. Another method for forming the core-clad glass in the desired shape of the shingle cover layer may be additive manufacturing.

Figure 7H:
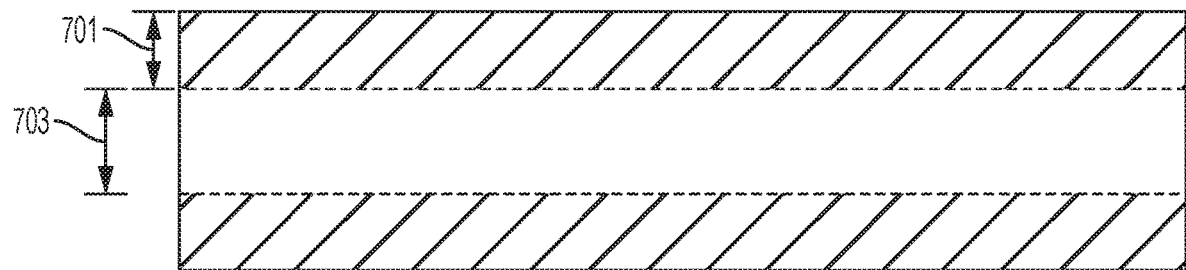

Strength can also be imparted into the shingle cover layer via other processes than a core-clad glass design, such as thermal tempering (FIG. 7H) where the glass substrates have a region near the surface in compression (701) and an interior region in tension (703). Thermally treated glasses should have surface compressive stresses of at least about 25 MPa, 50 MPa, or greater than 70 MPa. The compressive stress (including surface compressive stress) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

Figure 7I:
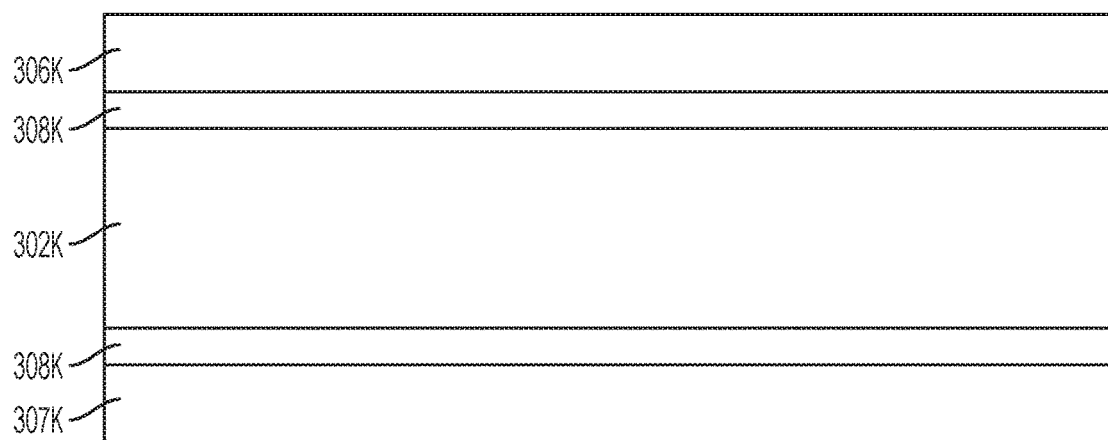

Another alternative design for the shingle cover layer 202 is the use of multiple glass layers having different CTEs and adhered together via adhesives to form a glass laminate structure. FIG. 7I provides an example embodiment wherein 302K is the core layer, 306K and 307K are cladding layers, and each 308K is an adhesive layer. While FIG. 7I shows three glass layers, it is possible to use two layers, or alternatively any integer number of glass layers over 3. Adhesives that can be used include ethylene vinyl acetate (EVA) or polyvinyl butyral (PVB) or similar common adhesives.

Figure 8:
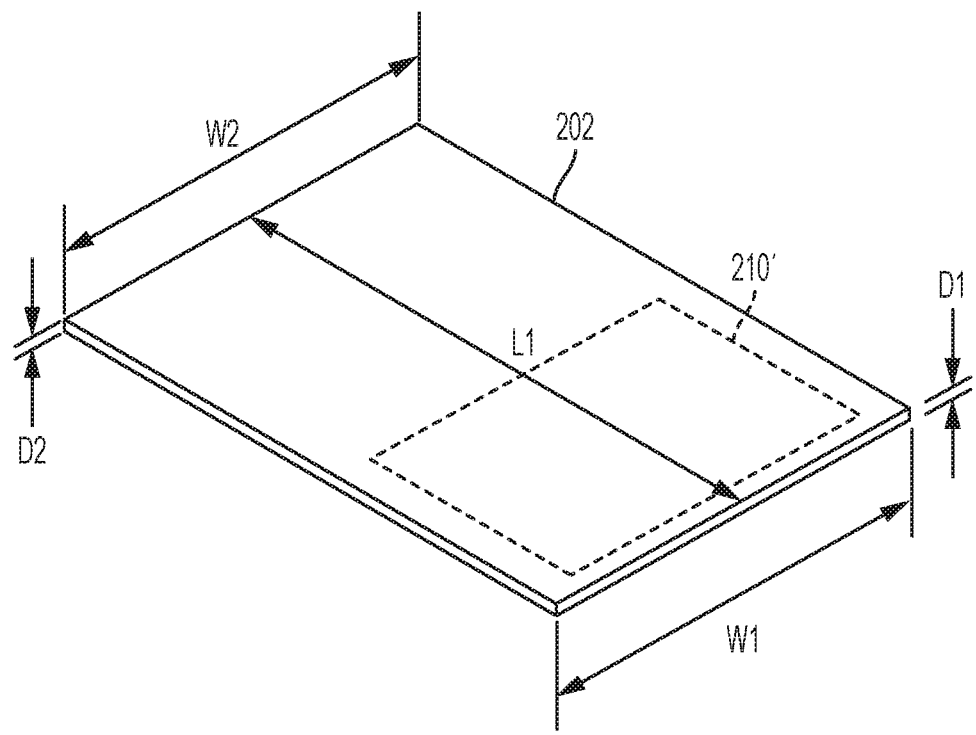
FIGS. 8 and 8A-8M show various shingle cover layer structures and shapes.

The shingle cover layer 202 may have various shapes besides a rectangular slab shape. FIG. 8 shows a representation of the shingle cover layer 202 with a front width W1, a back width W2, a length L1, a front thickness D1, and a back thickness D2. The dashed line 210' shows the area of the shingle cover layer 202 corresponding to the cavity 210, which would contain one or more PV modules in the case of a solar glass roof shingle. The terms "front" and "back" are relative to the representation. The shape of the shingle cover layer 202 may be altered by adjusting the parameters W1, W2, D1, and D2. In general, where the shingle cover layer 202 is made of laminated glass as described above, the cladding-core relationship of the laminated glass will be retained in the desired shape of the shingle cover layer.

In one example, the front width W1 and the back width W2 are equal. This will give the shingle cover layer 202 a rectangular profile, such as shown in FIG. 8.

Figure 8A:
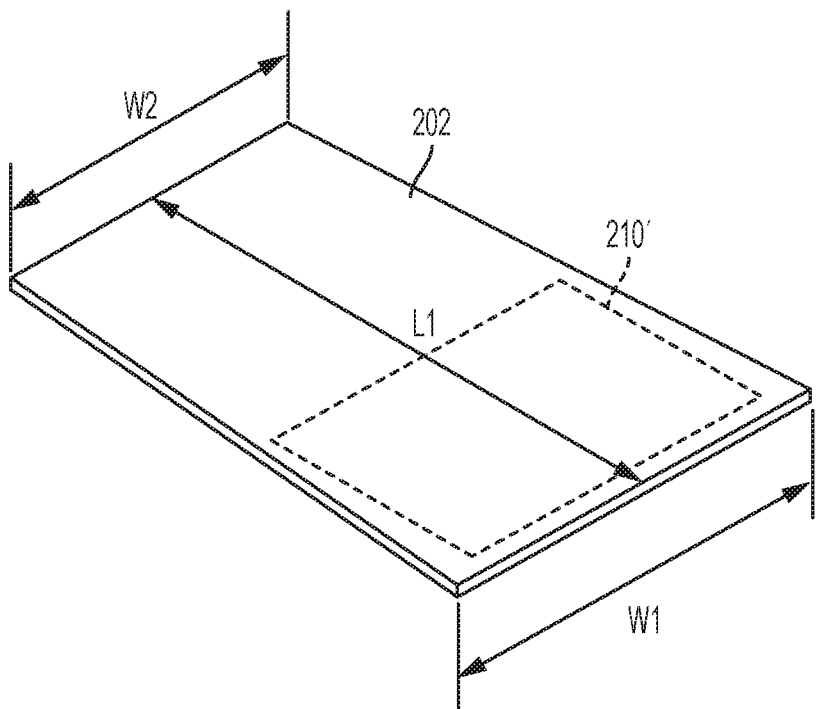

In another example, the front width W1 is larger than the back width W2, as shown, for example, in FIG. 8A. This will give the shingle cover layer 202 a tapered profile. It is also possible to make W2 larger than W1 such that the shingle cover layer 202 is tapered towards the front rather than towards the back.

Figure 8B:
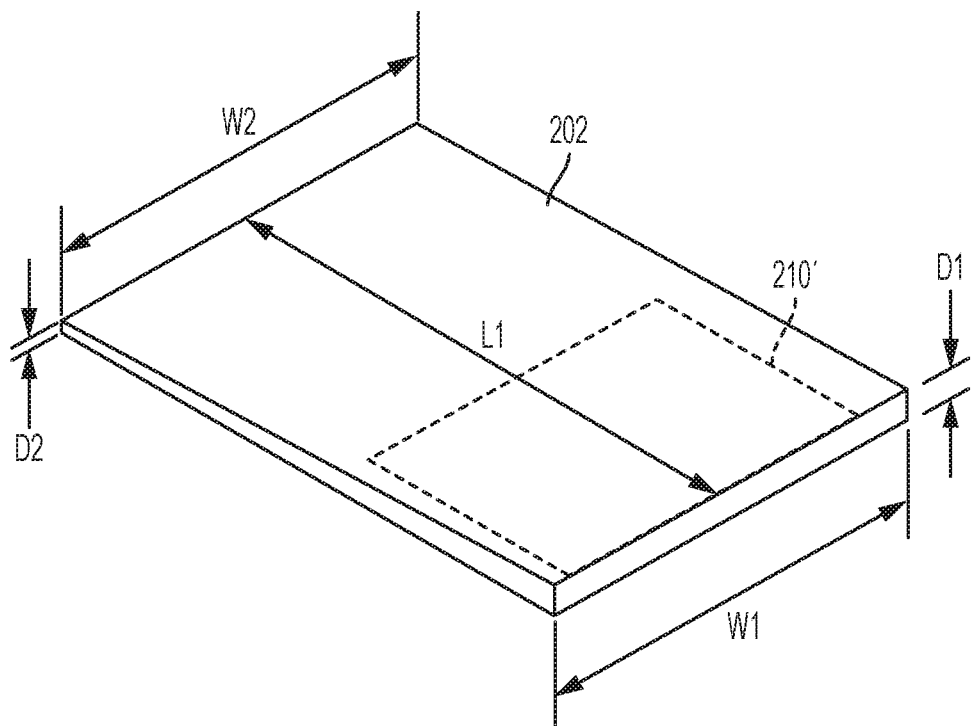

In another example, the front thickness D1 is larger than the back thickness D2, as shown, for example, in FIG. 8B. This will give the shingle cover layer 202 a wedge profile. It is also possible to make the back thickness D2 larger than the front thickness D1.

Figure 8C:
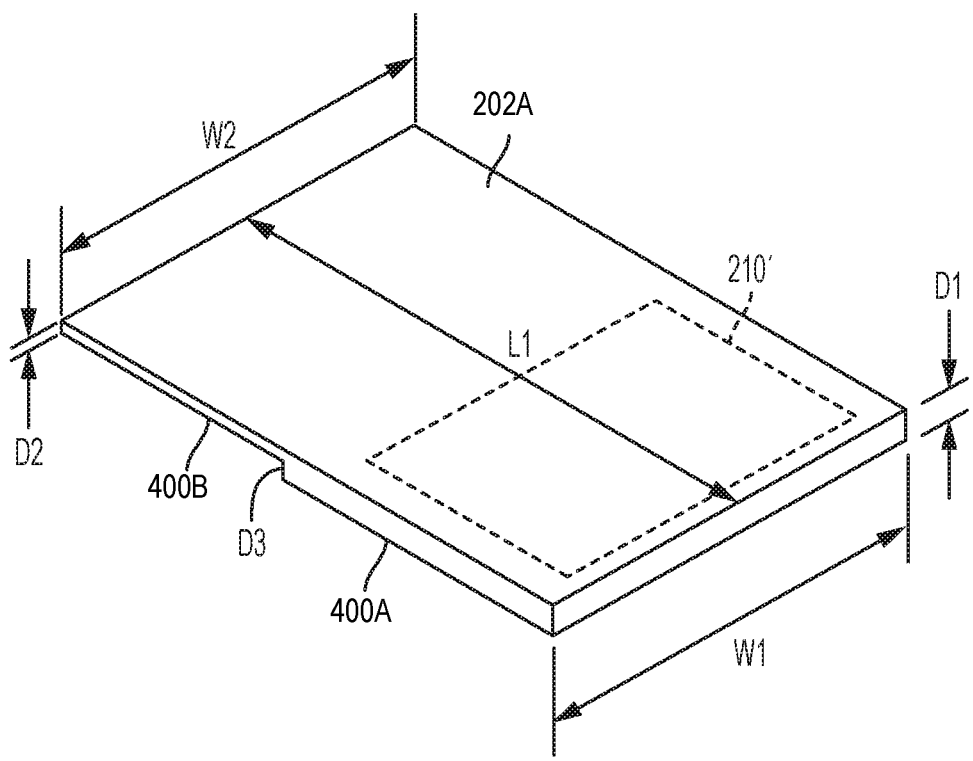

In another example, the shingle cover layer 202 has a stepped profile, as shown, for example, in FIG. 8C. The stepped profile is formed by two flat surfaces 400A, 400B at different levels on the underside of the shingle cover layer 202. The vertical distance between the flat surfaces 400A, 400B, i.e., step height, is shown at D3. The flat surfaces 400A, 400B may be generally parallel to the top surface 202A of the shingle cover layer 202. In FIG. 8C, the back diameter D2 is smaller than the front diameter D1, making the back flat surface 400B higher than the front surface 400A. It is possible to make the front diameter D1 smaller than the back diameter D2, which would make the back flat surface 400B lower than the front surface 400A.

Figure 8D:
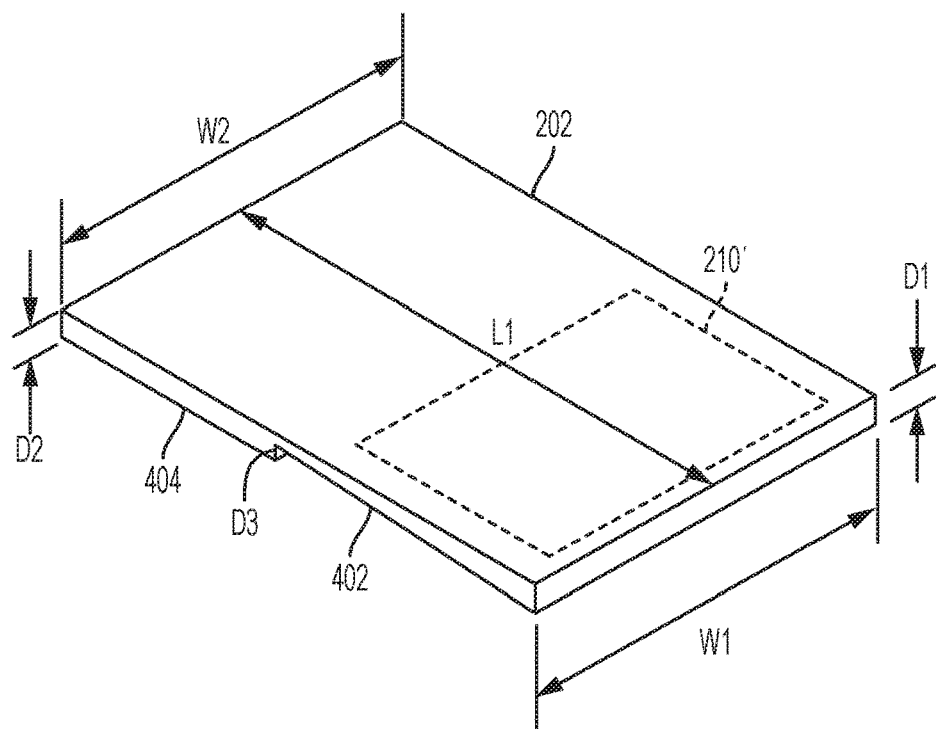

In another example, the shingle cover layer 202 may have an angled stepped profile, as shown, for example, in FIG. 8D. In this case, a sloping surface 402 and a flat surface 404 are formed at an underside of the shingle cover layer 202.

The angle of the sloping surface 402 can be controlled by the step height D3. In this case, the thicknesses D1 and D2 can be the same or different.

Figure 8E:
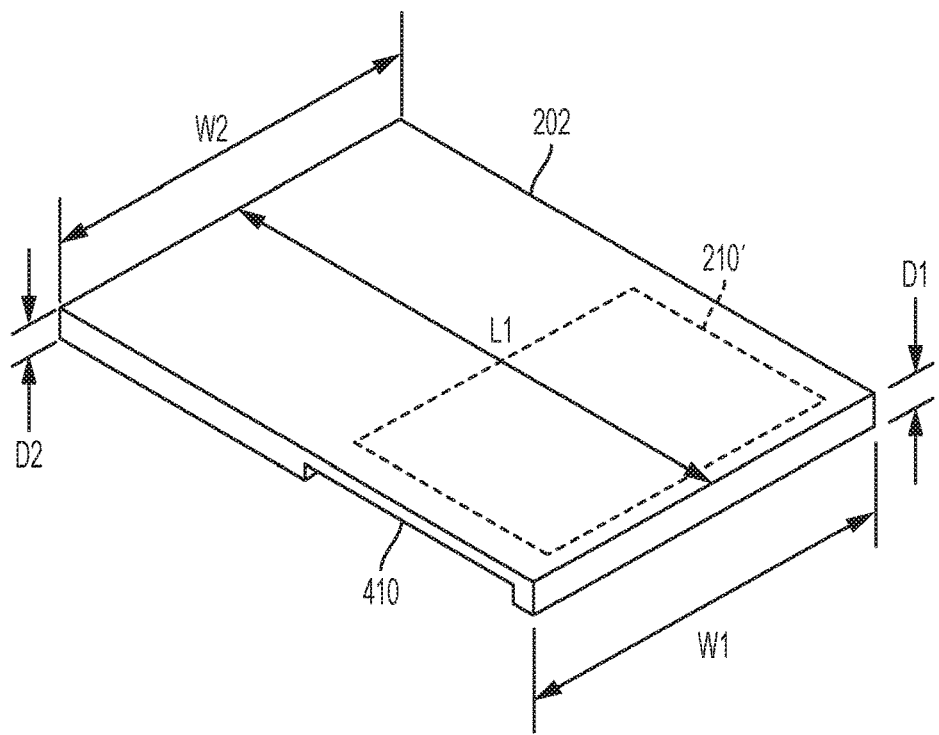
Figure 8F:
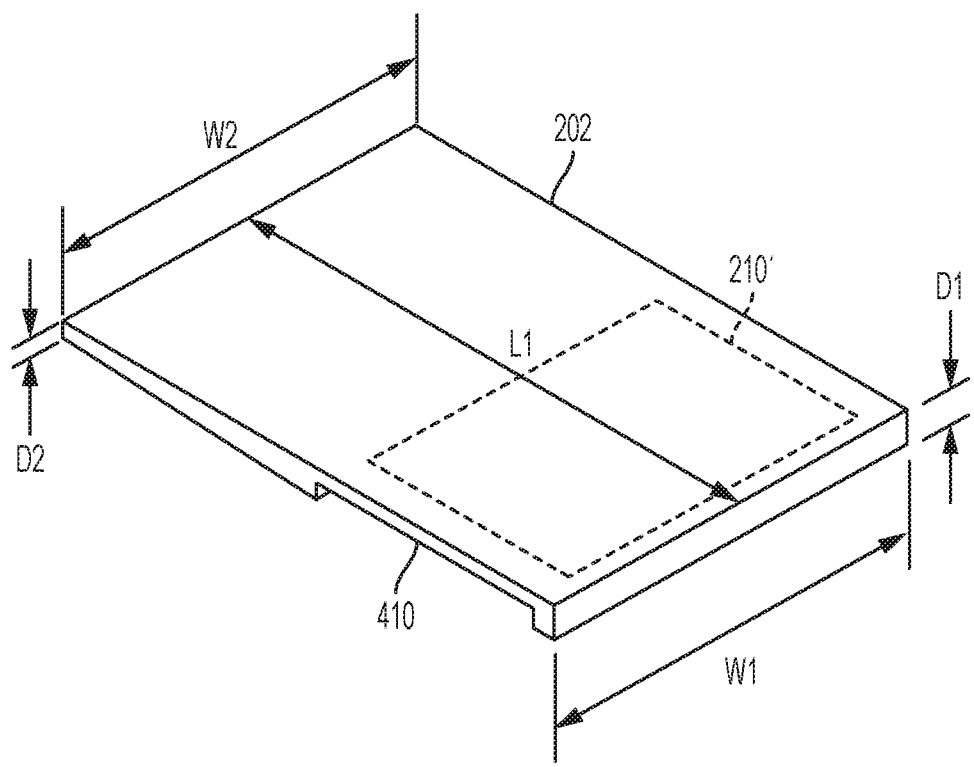

In another example, the underside of the shingle cover layer 202 may include a slot. FIG. 8E shows such an example, where a slot 410 is formed in the underside of the shingle cover layer 202. In FIG. 8E, the thicknesses D1 and D2 are equal. Further shaping can be achieved by making D1 and D2 different, as shown in FIG. 8F. In FIGS. 8E and 8F, the shingle base layer 204 (in FIG. 2A) can fit into the slot area and engage the underside of the shingle cover layer 202 to form the cavity 210 (in FIG. 2A).

Figure 8G:
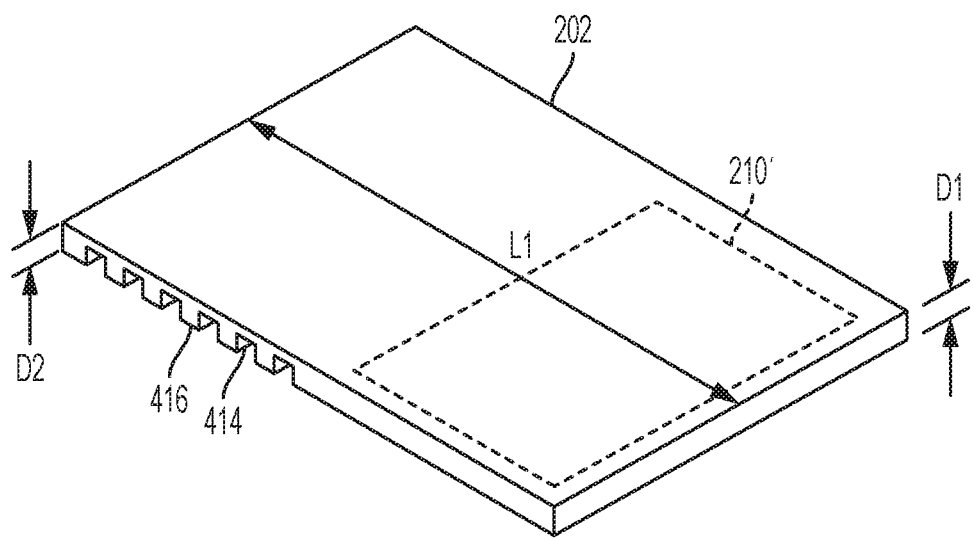
Figure 8H:
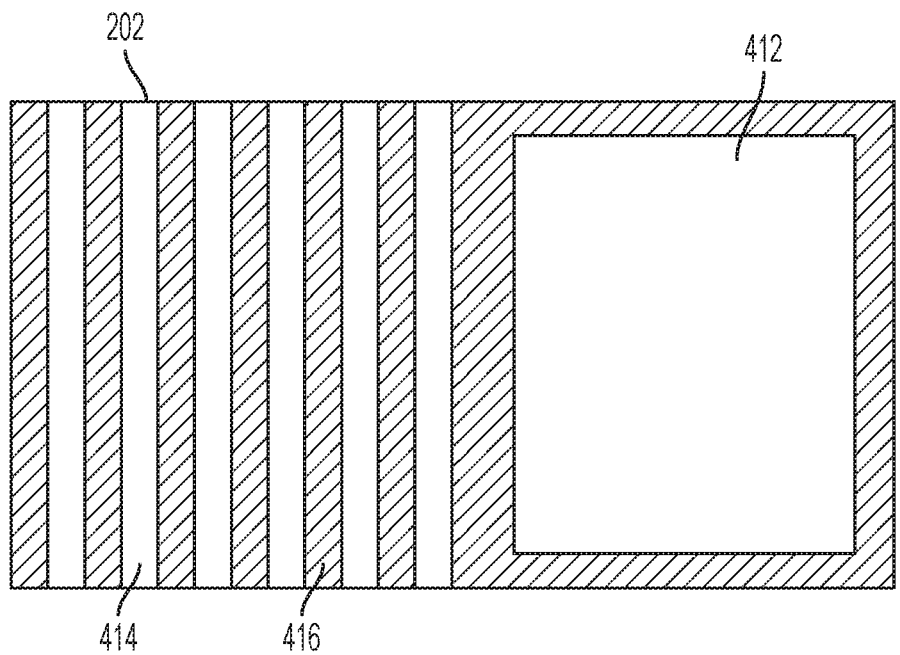

In another example, the underside of the shingle cover layer 202 may include multiple slots. FIGS. 8G and 8H shows an example where a pocket 412 (FIG. 8H) and smaller slots 414 are formed in the underside of the shingle cover layer 202. The smaller slots 414 form ribs 416 in the underside of the shingle cover layer 202. The ribs 416 will maintain the strength of the shingle cover layer 202 even as the overall weight of the shingle cover layer 202 is reduced by the slots 414 and pocket 412. The shingle base layer 204 (in FIG. 2A) can fit over the pocket 412 and engage the underside of the shingle cover layer 202 to form the cavity 210 (in FIG. 2A). The smaller slots 414 may permit air flow across the underside of the shingle cover layer 202 and facilitate removal of heat from the PV module.

Figure 8I:
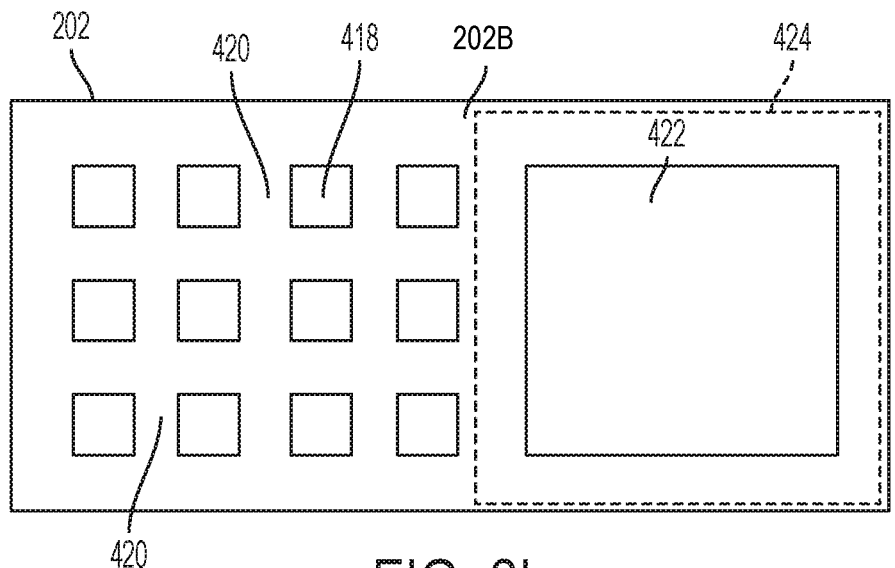

FIG. 8I shows another example where an array of posts 418 separated by channels 420 and a pocket 422 are formed at the underside 202B of the shingle cover layer 202. This will also help reduce the weight of the shingle cover layer. The shingle base layer 204 (in FIG. 2A) can overlap the pocket 422 and engage the underside of the shingle cover layer 202, as illustrated by the dashed line 424, to form the cavity 210. The channels 420 can allow air flow across the underside of the shingle cover layer 202, which may facilitate heat removal.

Figure 8J:
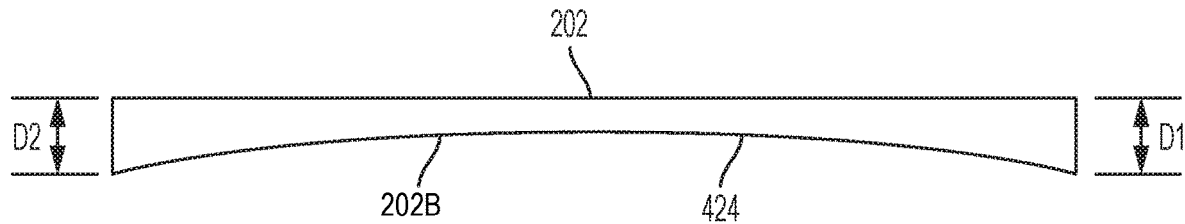
Figure 8K:
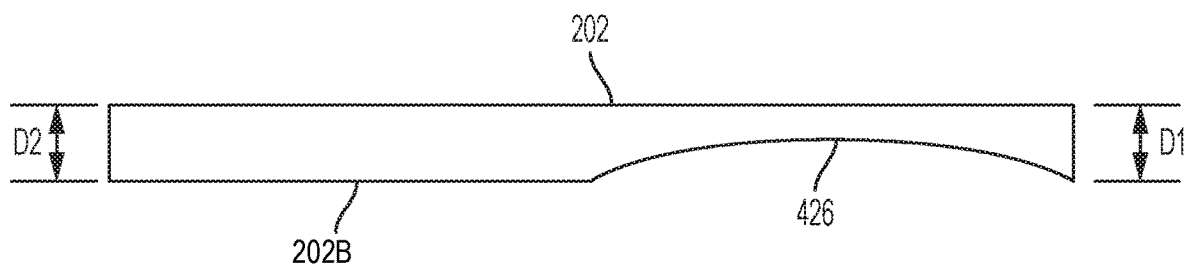
Figure 8L:
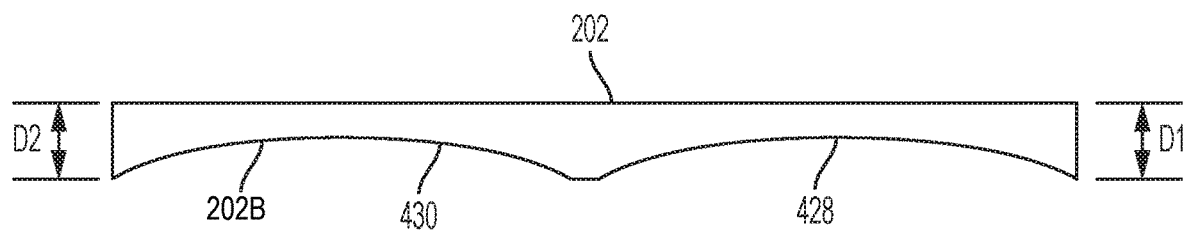

Other examples may include various shaping of the underside 202B of the shingle cover layer 202. FIG. 8J shows an example where a curved surface 424 is formed in the underside of the shingle cover layer 202 such that the underside appears dome-shaped or is concave (curves inwardly). The curved surface 424 extends generally across the underside of the shingle cover layer 202. FIG. 8K shows an example where a curved (concave) surface 426 is formed in the underside of the shingle cover layer 202. The curved surface 426 is formed generally in the front portion of the shingle cover layer 202. FIG. 8L shows an example where curved (concave) surfaces 428, 430 are formed in the underside of the shingle cover layer 202. The radii of curvature of the two curved surfaces 428, 430 may be the same or may be different.

Figure 8M:
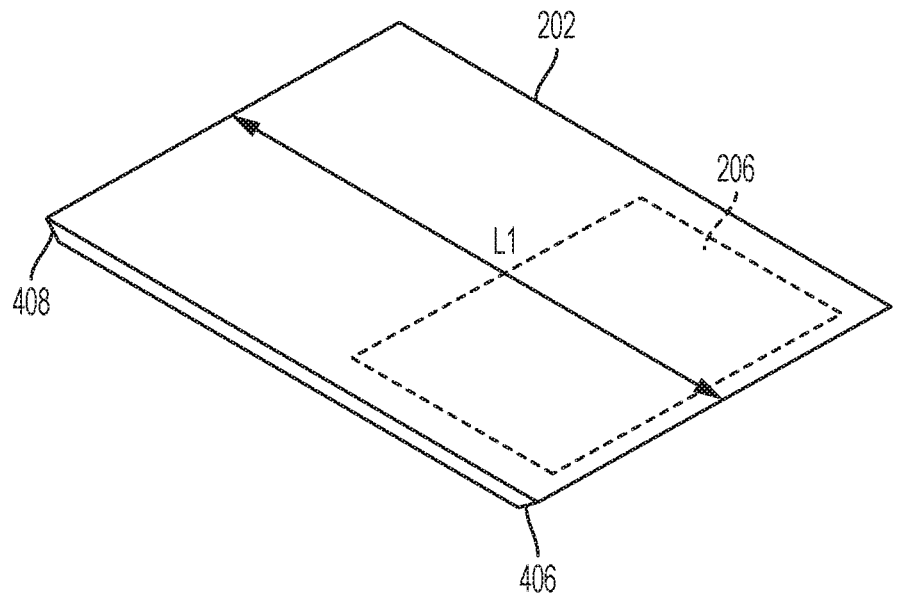

In another example, the edges of the shingle cover layer 202 may be beveled, as shown, for example, in FIG. 8M. Front beveled edge 406 and back beveled edge 408 are shown in FIG. 8M. Either or both of the front and back edges may be beveled. The side edges may be beveled as well. Instead of bevels, other edge shapes may be used, such as bull nose (rounded) edge profile. The bevel or other edge profile can be used to improve the edge strength of the shingle cover layer 202.

Figure 9A:
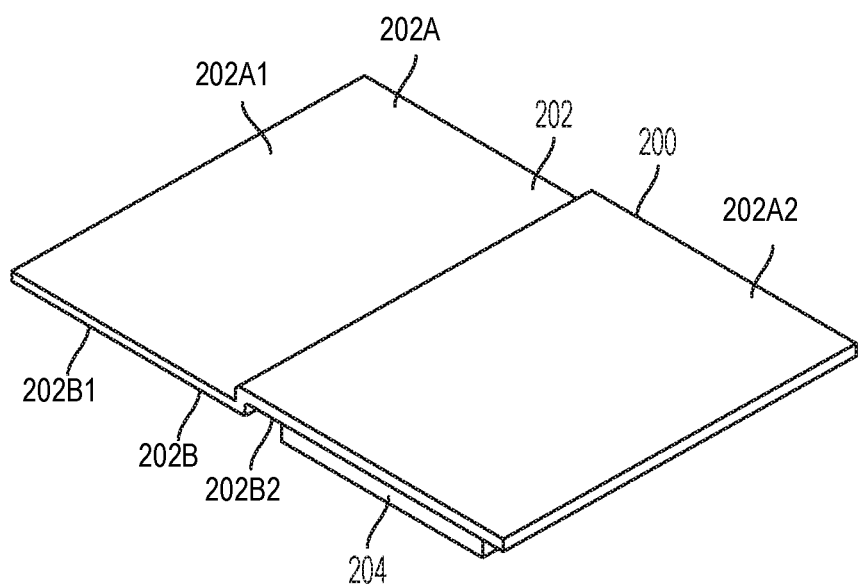
FIG. 9A shows a contoured shingle cover layer according to one embodiment.

Shaping of the shingle cover layer 202 is not limited to the underside of the shingle cover layer 202. The top surface of the shingle cover layer 202 may be contoured as well. FIG. 9A shows an example where the top surface 202A and the underside 202B of the shingle cover layer 202 are contoured. The contouring creates two flat surface sections 202A1, 202A2 at different levels at the top surface 202A and two flat surfaces 202B1, 202B2 at different levels at the underside 202B. The shingle base layer 204 engages the flat surface 202B2 to define the cavity that may contain one or more PV modules. The flat surface 202A1 may serve as a mounting area for another glass roof shingle during installation of glass roof shingles on a roof. When a thin film layer is formed on the top surface of the shingle cover layer 202, the characteristics of the thin film layer on the surface 202A2 may be selected to be different from that of the thin film layer on the surface 202A1. Thus, for example, the thin film layer on the surface 202A2 (which overlies the area containing the PV module) may be tailored to facilitate transmission of light rays in a desired wavelength range, while the thin film layer on the surface 202A1 need not be optically transparent and may be selected for properties such as wear resistance.

Figure 9B:
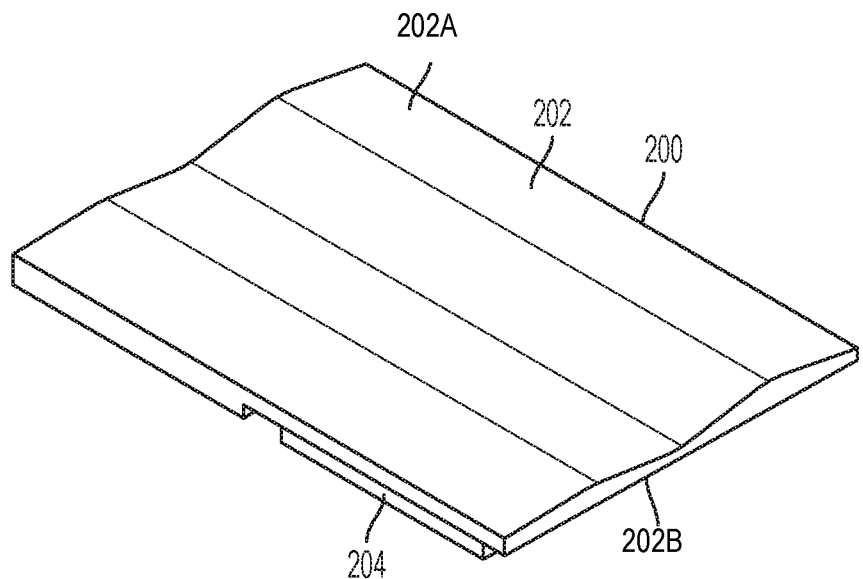
FIG. 9B provides an alternative shingle cover with a contoured top.
Figure 9C:
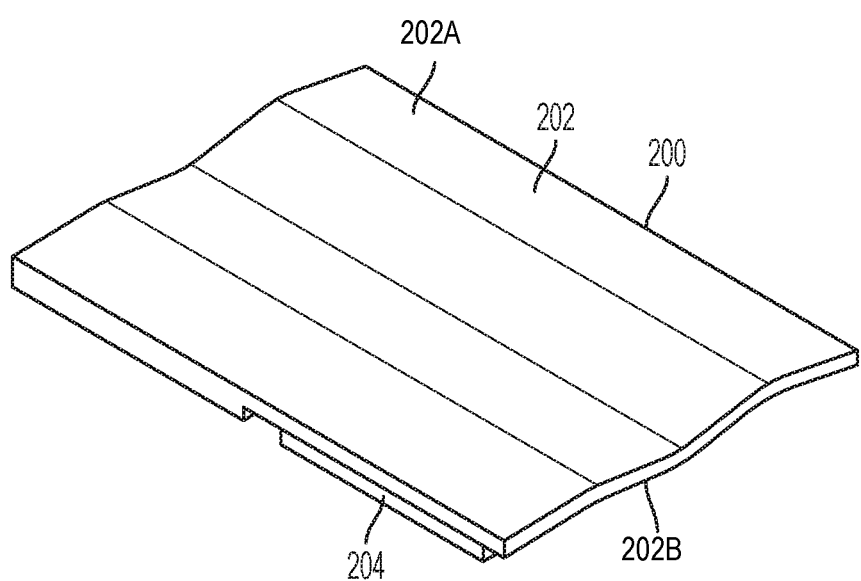
FIG. 9C shows a shingle cover layer shape with contoured top and bottom.

Other contouring of the shingle cover layer 202 is possible, especially for aesthetic purposes. For example, as shown in FIG. 9B, the top surface 202A of the shingle cover layer 202 may have a wavy contour, which may give the glass roof shingle an appearance similar to that of a conventional Tuscan-style roof shingle. The underside of the of the shingle cover layer 202 may also have a wave contour, as shown in FIG. 9C. In this case, the PV module may be of the flexible type that can conform to the wavy underside and/or the shingle base layer may have a wavy surface that can conform to the underside of the shingle cover layer 202. The wavy contour may be selected such that stacking of the glass roof shingle is possible.

Figure 9D:
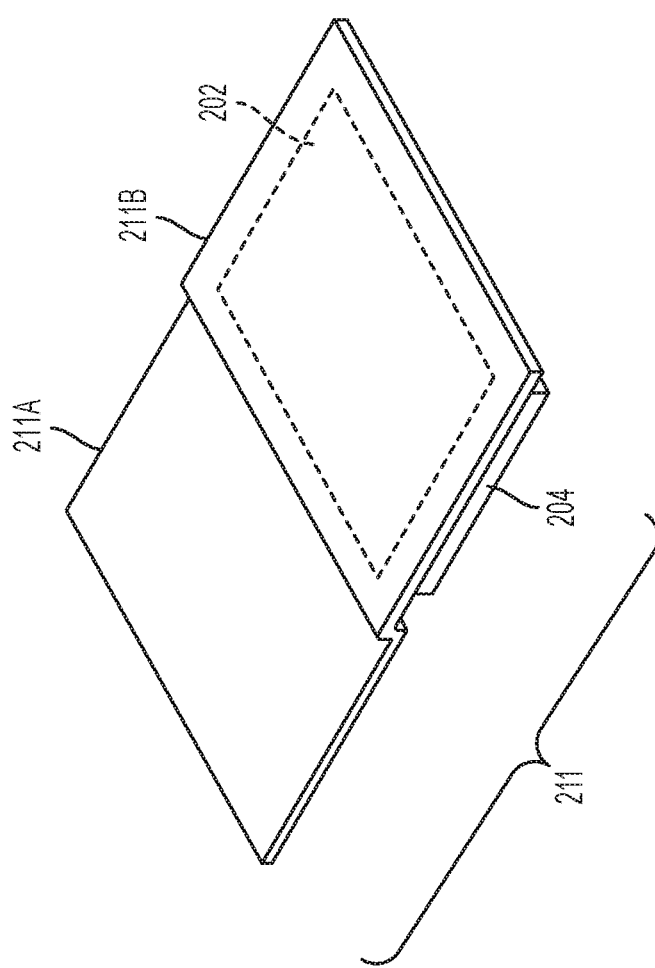
FIG. 9D is a shingle cover layer having a stepped design shape.

FIG. 9D shows that when a non-glass support structure 211 is present, it also can be shaped in a non-planar manner to allow for contouring of the shingle to fit the aesthetic or photovoltaic module needs. In FIG. 9D the contouring creates two flat surface sections as in FIG. 9A above. The shingle support structure 211A creates mounting region for the next shingle to locate while non-glass support structure PV region 211B creates a cavity that may contain one or more PV modules.

Any combination of the shape elements described above may be used in a shingle cover layer.

Figure 10A:
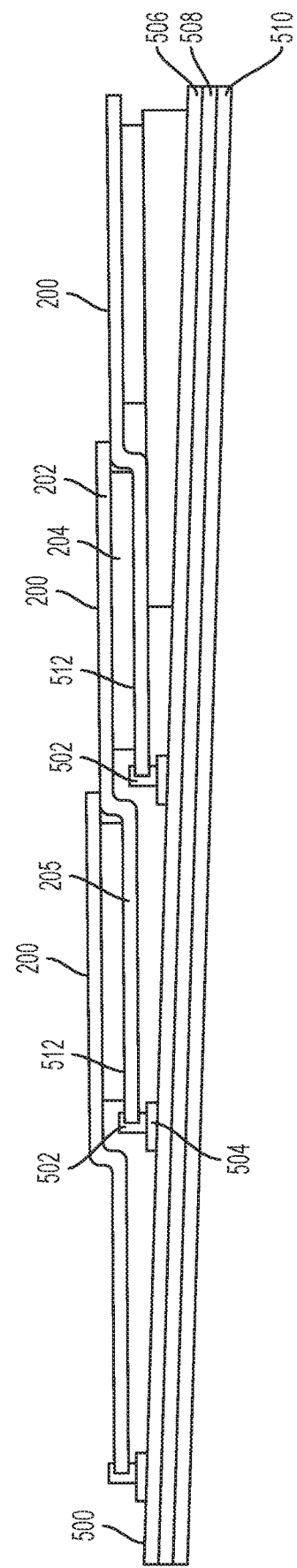
FIGS. 10A and 10B show glass roof shingles installed on a roof in cross-section (FIG. 10A) and isometric (FIG. 10B).
Figure 10B:
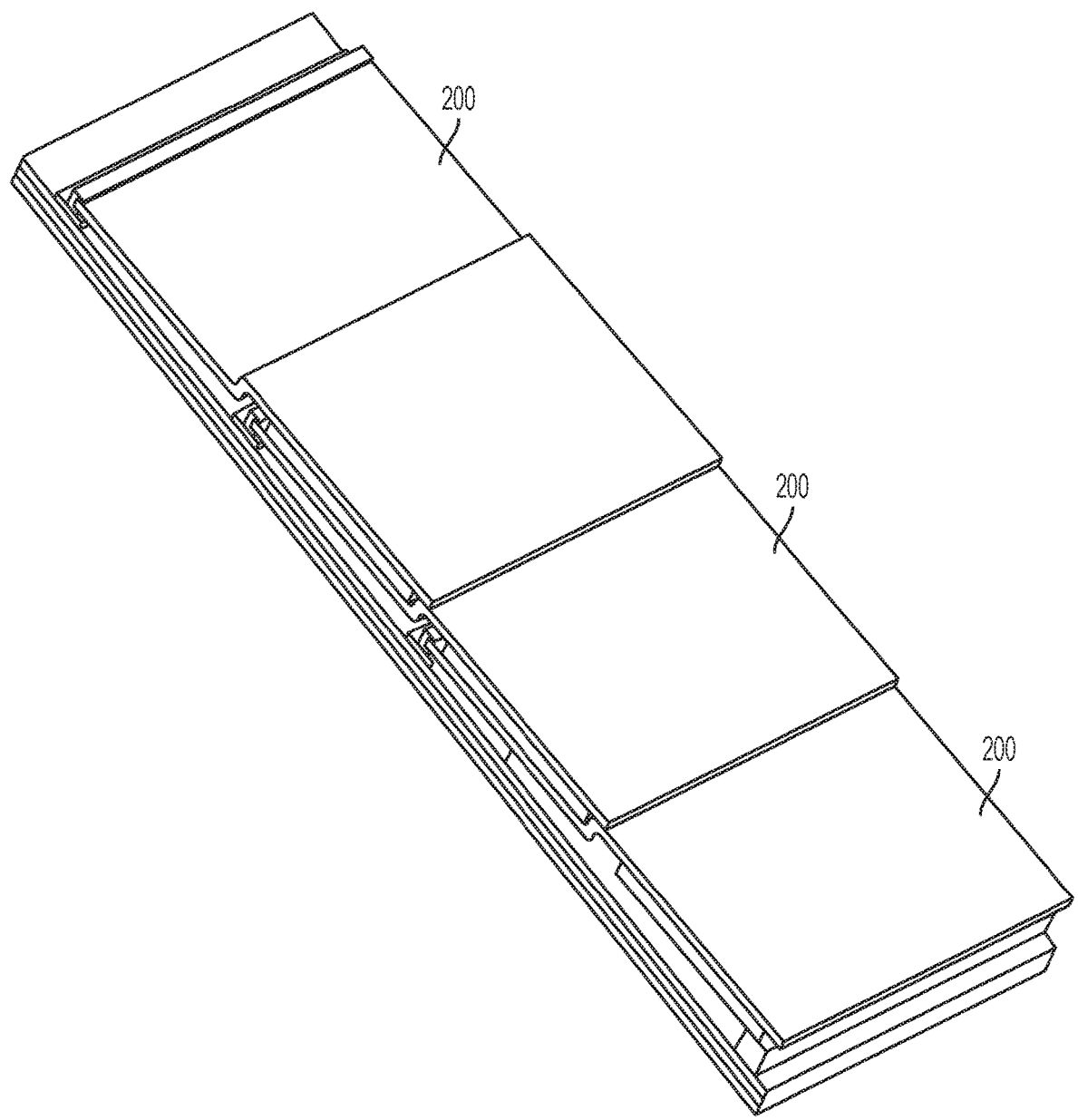

FIGS. 10A and 10B show glass roof shingles 200 installed on a roof 500 (although solar glass roof shingles 200 are shown as examples, it should be noted that non-solar glass roof shingles 200A can be similarly mounted on the roof). In FIG. 10A, the installation may include, for example, using clamps 502 to couple the mounting flanges 205 of the glass roof shingles 200 to the roof supports 504. The roof 504 may include a roof interlayer 506, a roof sheathing 508, and an optional interlayer 510. If the installation is such that portions of the glass roof shingles 200 lie directly on the roof, the roof interlayer 506 may offer protection to the glass roof shingles 200. Interlayer material 512 may be disposed between glass roof shingles to prevent direct contact between glass roof shingles. The interlayer material 512 may be formed as a thin film layer on the back of the shingle base layer 204 or as thin film layer on the mounting flange portion 205 of the shingle cover layer 202.

Figure 11A:
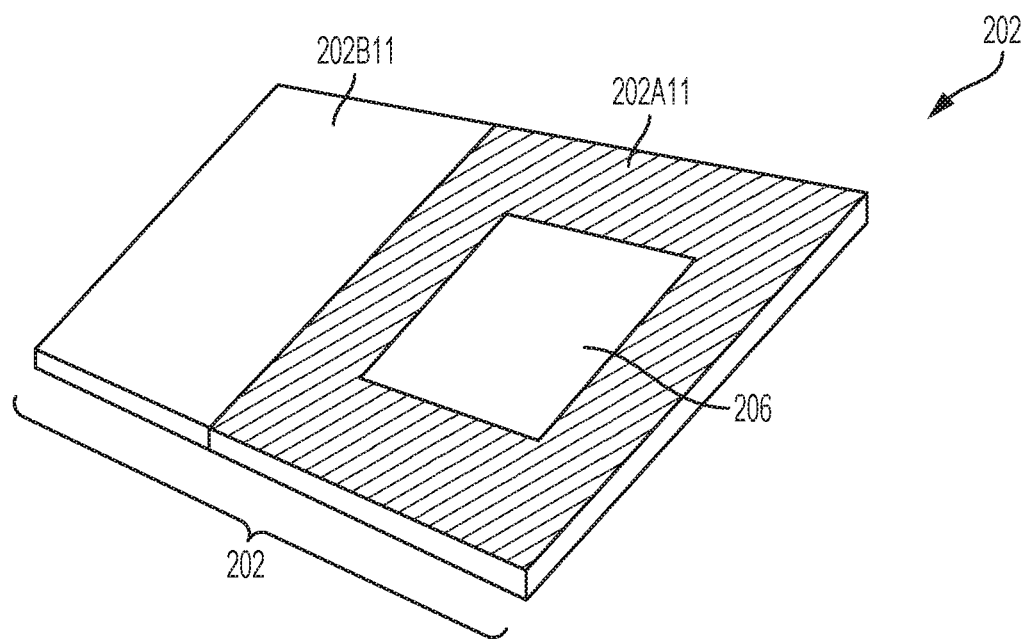
FIGS. 11A and 11B provide alternative embodiments of a shingle cover layer having a glass particle surface to mimic asphalt shingles.
Figure 11B:
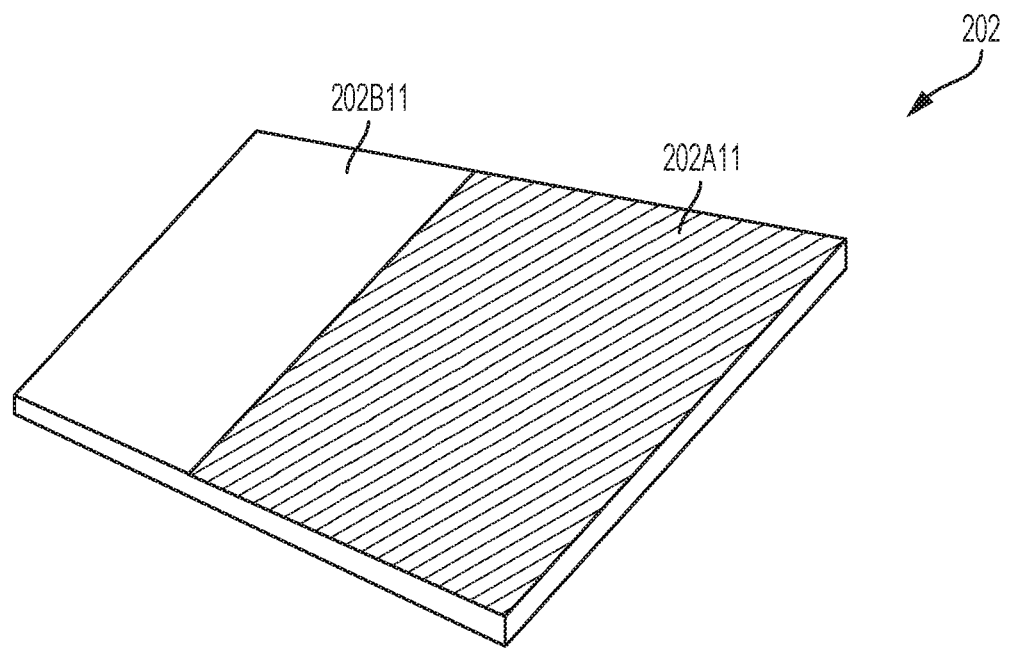

An alternative embodiment comprises the use of traditional-type shingles, such as asphalt shingles, for the non-solar shingles. In such a case, it is desirable for the solar shingles to look similar to the traditional-type shingles. Traditional asphalt shingles comprise asphalt layers with a layer of fiberglass or other structural material and a granule layer composed of stone that is crushed and colored or coated with a ceramic. An alternative design for such shingles would be to use crushed glass or glass particles as the granule layer, which could be optionally colored. This coating could then be mimicked on the solar shingles by incorporating a glass particle layer on the surface of the shingle cover layer. FIG. 11A provides an example wherein the shingle cover layer region outside of the photovoltaic module 206 is coated with glass particles (202A11) and the region above the PV module and the region that is covered by the next shingle (202B11) is uncoated. FIG. 11B is an alternative embodiment where the entire exposed area of the shingle cover layer is coated with glass particles (202A11) and the region above the PV module and the region that is covered by the next shingle (202B11) is uncoated. Coating of the shingle cover layer could be done during the forming process via roller or pressing methods or could be done via use of a laminating process. The glass particles may be useful for enhancing light scattering into the shingle to improve overall efficiency of the PV module. Further, it is advantageous if the glass particles absorb at least some of the ultraviolet light as UV light can damage the asphalt shingle as well as materials in the PV shingles. The root mean square average size of the glass particles (along their longest dimension) can be from about 300 microns to about 2 mm, with multiple groups of sizes in between these to produce a granule blend mixture. Ideally the particles would provide The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments, but should be defined only in accordance with the following claims and their equivalents.

The invention claimed is:

1. A photovoltaic roof shingle, comprising:
a shingle cover layer comprised of a chemically tempered glass having a thickness from about 0.7 mm (0.03 inches) to about 7 mm (0.3 inches) and having a depth of compression of at least 100 microns (0.004 inches) and a surface compressive stress of at least 300 MPa (43,500 psi);
a shingle base layer comprised of glass having a thickness from about 100 microns (0.004 inches) to 2.5 mm (0.1 inches) disposed underneath the shingle cover layer, wherein opposing surfaces of the shingle cover layer and the shingle base layer define a cavity;
a photovoltaic module disposed within the cavity, the photovoltaic module comprising an array of solar cells, the array of solar cells being configured for use at a select wavelength range; and
a seal area formed between the shingle base layer and the shingle cover layer and around the cavity to control ingress of moisture into the cavity.

2. The photovoltaic roof shingle of claim 1, wherein the photovoltaic module comprises a crystalline silicon photovoltaic module.

3. The photovoltaic roof shingle of claim 1, wherein the photovoltaic module further comprises a polymer sheet covering a surface of the array of solar cells and is disposed between the photovoltaic module and the shingle cover layer.

4. The photovoltaic roof shingle of claim 1, further comprising a thin film layer formed on a top surface of the shingle cover layer.

5. The photovoltaic roof shingle of claim 1, wherein at least one of a top surface and a bottom surface of the shingle cover layer is contoured.

6. The photovoltaic roof shingle of claim 1, wherein the shingle cover layer has an upper surface and at least a part of the upper surface of the shingle cover layer incorporates glass particles.

7. The photovoltaic roof shingle of claim 6, wherein the glass particles have a root mean square average size of the glass particles, along a longest dimension of the glass particles, from about 300 microns (0.01 inches) to about 2 mm (0.08 inches).

8. The photovoltaic roof shingle of claim 6, wherein the glass particles are thermally fused with the shingle cover layer.

9. A photovoltaic roof shingle, comprising:
a shingle cover layer comprised of a thermally treated glass having a thickness from about 0.7 mm (0.03 inches) to about 7 mm (0.3 inches) and having a surface compressive stress of at least 50 MPa (7,250 psi);
a shingle base layer comprised of glass having a thickness from about 100 microns (0.004 inches) to 2.5 mm (0.1 inches) disposed underneath the shingle cover layer, wherein opposing surfaces of the shingle cover layer and the shingle base layer define a cavity;
a photovoltaic module disposed within the cavity, the photovoltaic module comprising an array of solar cells, the array of solar cells being configured for use at a select wavelength range; and
a seal area formed between the shingle base layer and the shingle cover layer and around the cavity to control ingress of moisture into the cavity.

10. The photovoltaic roof shingle of claim 9, wherein the photovoltaic module comprises a crystalline silicon photovoltaic module.

11. The photovoltaic roof shingle of claim 9, wherein the photovoltaic module further comprises a polymer sheet covering a surface of the array of solar cells and is disposed between the photovoltaic module and the shingle cover layer.

12. The photovoltaic roof shingle of claim 9, further comprising a thin film layer formed on a top surface of the shingle cover layer.

13. The photovoltaic roof shingle of claim 9, wherein at least one of a top surface and a bottom surface of the shingle cover layer is contoured.

14. The photovoltaic roof shingle of claim 9, wherein the shingle cover layer has an upper surface and at least a part of the upper surface of the shingle cover layer incorporates glass particles.

15. The photovoltaic roof shingle of claim 14, wherein the glass particles have a root mean square average size of the glass particles, along a longest dimension of the glass particles, from about 300 microns (0.01 inches) to about 2 mm (0.08 inches).

16. The photovoltaic roof shingle of claim 14, wherein the glass particles are thermally fused with the shingle cover layer.

* * * * *